(12) United States Patent
Stumpe et al.

(10) Patent No.: US 8,026,021 B2
(45) Date of Patent: Sep. 27, 2011

(54) FILM FORMING MATERIAL AND PREPARATION OF SURFACE RELIEF AND OPTICALLY ANISOTROPIC STRUCTURES BY IRRADIATING A FILM OF THE SAID MATERIAL

(75) Inventors: Joachim Stumpe, Nauen (DE); Leonid Goldenberg, Berlin (DE); Olga Kulikovska, Berlin (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 1121 days.

(21) Appl. No.: 11/574,672

(22) PCT Filed: Aug. 30, 2005

(86) PCT No.: PCT/EP2005/009346
§ 371 (c)(1),
(2), (4) Date: Apr. 11, 2007

(87) PCT Pub. No.: WO2006/024500
PCT Pub. Date: Mar. 9, 2006

(65) Prior Publication Data
US 2009/0001632 A1 Jan. 1, 2009

(30) Foreign Application Priority Data

Sep. 3, 2004 (EP) .................................... 04020997
Dec. 9, 2004 (EP) .................................... 04029262

(51) Int. Cl.
*G11B 7/24* (2006.01)
*G03H 1/02* (2006.01)
(52) U.S. Cl. ........... 430/1; 430/2; 430/270.14; 430/945; 428/64.8; 359/3; 369/284

(58) Field of Classification Search .................. None
See application file for complete search history.

(56) References Cited

U.S. PATENT DOCUMENTS 2,787,614 A * 4/1957 Huber et al. ................. 534/596
2003/0141441 A1 7/2003 Kawano et al.

FOREIGN PATENT DOCUMENTS

| EP | 874028 | * 10/1998 |
| JP | 2002-071959 | * 3/2002 |
| WO | 2008/036298 A1 | 8/1998 |

OTHER PUBLICATIONS

STN abstract of Kryszewski et al., "Solid polyelectrolytes with linear and non-linear properties" Kryst. Mol. '91, Ogolonopol. Konf. (1991) pp. 66-68 (dated Aug. 1993) (1 page).*

(Continued)

*Primary Examiner* — Martin Angebranndt
(74) *Attorney, Agent, or Firm* — Gudrun E. Huckett

(57) ABSTRACT

The present invention is directed to a film forming, photoactive, homogeneously mixed material comprising a complex prepared from (a) at least one ionic photosensitive compound which may undergo a photoreaction, selected from photoisomerizations, photocycloadditions and photoinduced rearrangements, and/or (a') at least one photosensitive polyelectrolyte ("second polyelectrolyte") carrying residues which may undergo said photoreaction, and (b) at least one ("first") polyelectrolyte carrying charges which are opposite to those of the active groups of the photosensitive material. This material has unique photochemical properties in that non-scattering, optically clear films may prepared therefrom which allow light-induced generation of optical anisotropy and of topological surface structures, e.g. such as surface relief gratings (SRG).

46 Claims, 8 Drawing Sheets

OTHER PUBLICATIONS

Negishi et al. "Complex formation of amphiphilic polymers with azo dyes and their photoviscosity behavior", J. Polmer. Sic., Poly. Chem., Ed., vol. 20 pp. 1907-1916 (1982).*

Durate-Quiroga et al., "Dynamical optical microelements on dye sensitized gels", Appl. Opt. vol. 39(22) pp. 3948-3954 (Aug. 2000).*

Zlatanova et al. "Photoinduced changes in methyl orange polyimide layers", Opt. Mater. vol. 5 pp. 279-283 (May 1996).*

Seckin et al., "Post grating of congo red dye onto hyperbranched mesoporous silica with terminal amino groups", J. Poly. Sci. vol. 90 pp. 3905-3911 (2003).*

Ebralidze et al. ", Photoinduction of anisotropic grains in organic compounds", Appl. Opt., vol. 37(26) pp. 6161-6163 (Sep. 1998).*

Jeon et al., "Complexes of polyelectrolyte hydrogels with organic dyes . . . ", J. Poolemr. Sci. Part B:polymer. Phys., vol. 37 pp. 1209-1217 (1999).*

Uznanski and Pechez, "Surface plasmon resonance of azobenzene-incorporated polyelecvtrolyte . . . ", J. Appl. Poly. Sci., vol. 86 pp. 1459-1464 (2002).*

Shibayama et al. "Complexation of polyvinyl alcohol—congo red aquesous solutions . . . "Macromol. vol. 27(7) pp. 1738-1743 (1994).*

Petrak, "intreractions between dyes and polyelectrolytes . . . ", J. Appl. Poly. Sci., vol. 29 pp. 3991-3998 (1984).*

Takagishi et al. "Binding of metylorange and its homologs . . . ", J. Polymer. Sci., Poly. Chem Ed., vol. 19 pp. 3237-3246 (1981).*

Kitaoka et al., "Optical poling of phenyl-silica hybrid thin films doped with . . . ", Jpn. J. Appl. Phys vol. 38 pp. L-1029-L1031 (Sep. 1999).*

Dave et al. Photochemical studies using organic-inoraganic sol-gel materials:, Mat. Res. Soc. Symp. Proc., vol. 435 pp. 565-574 (1996).*

Wu et al. "Non-volatile grating in an azobenzene polymer with opticmized molecular reorientation", Appl. Phys. Lett., vol. 78(9). pp. 1189-1191 (Feb. 2001).*

Primagi et al. "Polymer-dye complexes: a Facile method for high doping level . . . "Chem. Mater., vol. 17(23) pp. 5798-5802 (2005).*

Darracq et al. Photoinscription of Surface Relief Gratings on Azo-Hybrid Gels, Advanced Materials, 1998, vol. 10 No. 14; Wiley-VCH Verlag GmbH, Weinheim, Germany; XP 000781881.

Ubukuata T. et al.; "Surface Relief Gratings in Host-Guest Supramolecular Materials"; Advanced Materials; Wiley VCH, Weinheim, Germany; vol. 12, No. 22, 16 Nov. 2000, pp. 1675-1678.

He Jin-An et al.; "Surface Relief Gratings from Electrostatically Layered Azo Dye Films"; Applied Physics Letters, AIP, American Institute of Physics, Melville, NY, USA; vol. 76, No. 22; 29 May 2000, pp. 3233-3235.

He Jin-An et al.; "Photochemical Behavior and Formation of Surface Relief Grating on Self-Assembled Polyion/Dye Composite Films"; J. Phys. Chem. B; Nov. 2000, ACS, Washington, DC, USA; vol. 104, No. 45, pp. 10513-10521.

Park Mi-Kyong et al.; "In-Plane Photoalignment of Liquid Crystals by Azobenzene-Polyelectrolyte Layer-by-Layer Ultrathin Film"; Langmuir, May 28, 2002; vol. 18, No. 11; pp. 4532-4536.

K. Ichimura, Photoalignment of Liquid-Crystal Systems; Chem Rev. 2000, 100, 1847-1873—cited in specification (p. 1, 2nd paragraph).

A. Natansohn et al.; Photoinduced Motions in Azo-Containing Polymers; Chem Rev. 2002, 102, 4139-4175—cited in specification (p. 1, 2nd paragraph).

V. Shibaev et al., Photoactive liquid crystalline polymer systems wit light-controlled structure and optical properties; Prog. Polym. Sci. 28 (2003) 729-836—cited in specification (p. 1, 2nd paragraph).

J. Si et al.; Photoinduced permanent gratings inside bulk azodye-doped polymers by the coherent field of a femtosecond laser; Appl. Phys. Lett. vol. 80, No. 3, Jan. 21, 2002—cited in specification (p. 1, 3rd paragraph).

C. Fiorini et al.; Molecular migration mechanism for laser induced surface relief grating formation; Synthetic Metals 115 (2000) 121-125.

V. Chigrinov et al.; Azodye Aligning Layers for Liquid Crystal Cells; SID 02 Digest, 1106-1107.

V.A. Konovalov et al. ; Photo-Aligned VAN LCD; EURODISPLAY 2002, 529-532.

W.C. Yip et al.; Photo-patterned e-wave polarizer; Displays 22 (2001) 27-32.

A. Ziegler et al.; Photoorientation of azobenzene moieties in self-assmbled polyelectrolyte multilayers; Colloids and Surfaces , A: Physicochemical and Engineering Aspects 198-200 (2002) 777-784.

V. Zucolotto et al.; Mechanisms of surface-relief gratings formation in layer-by layer films from azodyes; Polymer 44 (2003) 6129-6133.

E.B. Barmatov et al.; Phase State and Photooptical Behavior of Blends of LC Copolymers with Low-Molecular-Mass Photochromic Additives Stabilized by Hydrogen Bonds; Polymer Science Series A vol. 43, No. 3, 2001, pp. 468-477.

W: Dawydoff et al.; Bildungsweise, Struktur und AnwendungsmOglichkeiten von Komplexen zwischen Polyelektrolyten und ionischen Farbstoffen (Literaturubersicht); Acta Polymerica 43 (1991) Heft 12.

A.F. Thünemann et al., Self-Assembled Complexes of Diazosulfonate Polymers with Low Surface Energies; Macromolecules 1999, 32, 7414-7421.

A.F. Thünemann et al., Diazosulfonate Polymer Complexes: Structure and Wettability; Macromolecules 2000, 33, 5665-5671.

M. Ozaki et al.; Photoinduced Surface Relief Gratingon Composite Film of Conducting Polymer and Polyacrylate Containing Azo-Substituent; Jpn. J. Appl. Phys. vol. 39 (2000) pp. L616-L616.

Y. He et al.; Synthesis, self-assembly and photoinduced surface-relief gratings of a polyacrylate-based Azo polyelectrolyte; Optical Materials 26 (2004) 89-93.

L. Sharma et al. ; Investigation into the Surface Relief Grating Mechanism via XPS in new Azobenzene Based Optical Material; Polem. Adv. Technol. 13 481-486 (2002).

A. Natansohn et al.; Stabiliy of Photoinduced Orientation of an Azo Compound into a High-Tg Polymer; Chem. Mater. 1995, 7, 1612-1615.

Isori Kunihiro et al.: Photoresist Composition, Patent Abstracts of Japan # 58-143340; publication date: Aug. 25, 1983.

Nonaka Takeshi et al.: Nonlinear High-Polymer Material; Patent Abstracts of Japan # 03211531 A, publication date: Sep. 17, 1991.

* cited by examiner a  b

FILM FORMING MATERIAL AND PREPARATION OF SURFACE RELIEF AND OPTICALLY ANISOTROPIC STRUCTURES BY IRRADIATING A FILM OF THE SAID MATERIAL

BACKGROUND OF THE INVENTION

The present invention relates generally to a new type of film forming material having unique photochemical properties. Non-scattering, optically clear films formed from the new materials can be easily prepared. They allow light-induced generation of optical anisotropy (photo-induced dichroism and birefringence) therein and of topological surface structures, e.g. such as surface relief gratings (SRG). The material comprises a complex prepared from at least two components: 1) an anionic or cationic polyelectrolyte and 2) an oppositely charged cationic or anionic photosensitive low molecular weight compound or a second, oppositely charged polyelectrolyte carrying photosensitive side chains, the low molecular weight compound and the photosensitive side chains of the second polyelectrolyte, respectively, having the ability to undergo E/Z isomerization or to participate in a photo-cycloaddition or in a photo-rearrangement reaction or another reaction capable of generating optical anisotropy in the material upon irradiation. The homogeneous material based on this complex readily forms films, preferably on solid substrates or between two such substrates from water/alcoholic or organic solvents.

It is known that amorphous and liquid crystalline polymers containing azobenzene or other photoactive moieties such as stilbenes, cinnamates, coumarins in side chains or main chains can be used for the induction of anisotropy by photo-orientation (K. Ichimura, Chem. Rev. 2000, 100, 1847; A. Natansohn et al., Chem. Rev. 2002, 102, 4139; V. Shibaev et al., Prog. Polym. Sci. 28 (2003) 729-836; X. Jiang, et al., WO 98/36298). Azobenzene derivatives are also known for their ability to form SRG when being exposed to gradient light field (A. Natansohn et al., supra)

Different types of azobenzene containing materials were used for optical anisotropy and/or SRG generation. In one approach ("guest-host" systems), this was attained by mixing of photochromic azobenzene derivatives, e.g. 4-[4-N-n-hexyl-N-methylamino-phenylazo]-benzoic acid or modified Direct Red 1 azodye with readily available polymer PMMA as a matrix (J. Si et al., APPL. PHYS. LETT. 80, 2000, 359; C. Fiorini et al., Synthetic Metals 115 (2000), 121-125). However, the effects to be observed are rather weak, due to low dye loading caused by dye-polymer segregation. Relatively high loading of the photochromic material in the polymer matrix could be observed with specially synthesized dyes, which allow avoiding a dye-polymer segregation (C. Fiorini et al., see above). But in such systems the photo-induced dichroism was not stable, and the SRG formation was not effective (up to 50 nm deep). Relatively stable birefringence has been induced only when commercially available Direct Red 1 was introduced into very high-$T_g$ poly(ether ketone). It is unknown whether SRGs can be generated in the latter system. Such materials were used for the recording of orientational holograms.

Better results have been obtained by chemically binding azodye compounds to a polymeric material. The material is characterized by covalent bonds between the photoactive units and the polymeric backbone. In addition to the fact that the results observed are much better than in the "guest-host" approach, such polymer materials normally have good film forming properties. However, environmentally non-friendly organic solvents have to be used. Often the solubility of the polymers is a problem which is hardly to overcome. Special synthesis is required to manufacture such functional polymers from commercially available chemicals, and consequently, they are expensive. Moreover, the purification of the polymers is a difficult problem as well.

Moreover, a specially synthesized monomeric azobenzene derivative has been found which is able to form glassy films (V. Chigrinov et al., 1106•SID 02 DIGEST; V. A. Konovalov, et al., EURODISPLAY 2002, 529; W. C. Yip et al., Displays, 22, 2001, 27). In films of these low molecular weight glass forming compounds optical anisotropy was induced by irradiation with linearly polarised light. Usually monomeric dye compounds have poor film forming properties and tend to crystallize.

A layer-by-layer (LBL) dipping procedure has been employed to obtain films for photo-induced orientation and SRG formation (see e.g. A. M.-K. Park et al, Langmuir 2002, 18, 4532; Ziegler et al., Colloids and Surfaces, A 198-200 (2002), 777-784; V. Zucolotto et al., Polymer 44 (2003), 6129-6133). In such systems, readily available polyelectrolytes and low molecular weight azodyes possessing at least two ionic groups, azobenzene containing bolaamphiphiles, ionenes or polyelectrolytes covalently substituted with azobenzene moieties are used. In the typical procedure, a substrate is alternately immersed for about 10-20 min in an aqueous solution of a cationic polyelectrolyte, such as poly-DADMAC, and an anionic azobenzene containing compound, respectively. Each immersion results in the formation of a monolayer on the substrate surface with typical thickness of about 1 nm. Numerous repetition of this procedure results in a multilayer film. About 150 layers are required to obtain a reasonable thickness of the resulting layer. Films up to 700 layers can be produced. SRGs with an amplitude of up to 120-140 nm can be generated, wherein a photoinduced orientation of the azobenzene moieties can be observed. The procedure is tedious and time consuming. Moreover, rather thick films are necessary for the inscription of deep SRG, and such films are difficult to obtain.

Another approach using H-bonds between the polymeric backbone and the photochromic compounds has been employed (E. B. Barmatov et al., Polymer Science, Ser. A, Vol 43 (3), 2001, 285). In this way, films with the ability for photoorientation were obtained.

In these concepts, the components are bound to each other by Coulomb attraction or H-bonds. Similar attraction is possible between oppositely charged ionic moieties in solution. The interaction of polyelectrolytes with dyes in dilute solutions has been studied (W. Dawydoff et al., Acta Polym. 1991, 42, 592). Recently, complexes of polyelectrolytes with another, oppositely charged polyelectrolyte containing a diazosulfonato moiety in the side chain were fabricated as a solid material (A. F. Thunemann et al., Macromolecules 1999, 32, 7414; 2000, 33, 5665). The molecular photochemistry and light-induced subsequent physical processes of these materials such as photoorientation and photo-induced diffusion, were not investigated.

In summary, a multiplicity of chemical systems making use of the photochemical properties of photochromic azobenzene dyes has been developed during the past few years. Such compositions may form films, which allow introduction of optical anisotropy and/or the generation of surface relief structures therein. However, despite the intense search for effective and readily available compositions, they are all connected with certain disadvantages as outlined above.

SUMMARY OF THE INVENTION

The inventors found novel, photoactive, film forming materials combining high efficiency of the induction of optical anisotropy as well as of surface relief structures with the simplicity of material preparation.

One of the inventive materials consists of a complex prepared from at least two components: 1. an anionic or cationic polyelectrolyte and 2. a opposite charged cationic or anionic photosensitive compound, in general a low molecular weight molecule. Further components such as plasticizers, conventional organic oligomers or polymers, other photosensitive compounds, dyes, or liquid crystalline compounds can be added to modify formulation properties, and the properties of the films (flexibility of the film, hydrophilic/hydrophobic properties and the like). The invented materials readily form films on solid substrates from water/alcoholic or organic solvents. Optical anisotropy and/or surface relief structures can be induced in these films upon irradiation with light.

The photosensitive compound suitable for the said complex is an ionic compound which is capable to undergo a photoreaction, and mainly selected from photoisomerization, photocycloaddition reactions and photoinduced rearrangements. If it is capable to undergo a photoisomerization, it is of formula I or II

$[R-P-R']^{n+} \; n/x \; A^{x-}$ (I) or

$n/x \; A^{x+} \; [R-P-R']^{n-}$ (II)

wherein P is a group which is capable of photo-induced E/Z isomerization, and R and R' are independently selected from optionally substituted and/or functionalized aryl groups or aryl-containing groups at least one of which is positively or negatively charged, A is a cation or anion which is oppositely charged, n is preferably 1 or 2, more preferably 1, but may in specific cases be higher (3 or 4), and x is 1 or 2. Preferably, P is an azo group —N=N—, or comprises more than one such group. However, the invention is not restricted to compounds of formulae I or II containing one or more azo groups. For example, P may be —C=N— or, —C=C—. It is preferred in any of the mentioned cases that at least one of the aryl moiety is directly bound to the group P.

If the ionic compound is capable to undergo a photocycloaddition or photoinduced rearrangement, it is of formula III or IV:

$[R^1-Q-R^{1'}]^{n+} \; n/x \; A^{x-}$ (III)

$n/x \; A^{x+} \; [R^1-Q-R^{1'}]^{n-}$ (IV)

wherein Q is a group capable of participating in a photocycloaddition, preferably a (2+2) addition or a (4+4) addition, or capable of participating in a photoinduced rearrangement, preferably the rearrangement of spiropyranes to merocyanines, or the so called Photo-Fries reaction, and $R^1$ and $R^{1'}$ are independently selected from optionally substituted or functionalized groups which have electron-accepting properties or comprise at least one aryl moiety or such (a) group(s) which together with Q form an aryl ring or heteroaryl ring. At least one of $R^1$ and $R^{1'}$ is positively or negatively charged, or the ring structure and/or a substituent thereon will carry at least one positive or negative charge. A, n, and x are defined as for formulae I and II.

In case the photocycloaddition is a (2+2) addition, Q will preferably contain a —C=C— or a —C=N— bond and will more preferably consist of the group —$CR^2$=$CR^{2'}$— or —$CR^2$=N— wherein $R^2$ and $R^{2'}$ are independently selected under H or a $C_1$-$C_4$ group. Preferably, Q is part of a conjugated pπ-electron system. Examples for respective compounds are cinnamates, imines, stilbenes, chalcones, or p-phenylene diacrylic esters or amides, wherein at least one of $R^1$ and $R^{1'}$ is an optionally substituted or functionalized phenyl or other aryl or heteroaryl ring and the other is also an optionally substituted or functionalized phenyl or other aryl or heteroaryl ring or a carboxylic ester or carbonamide group or a phenyl carbonyl residue. All the said groups or residues may be substituted or functionalized, and at least one of $R^1$ and $R^{1'}$ must carry at least one positive or negative charge. Alternatively, Q may be a —C=C— group which is part of a carbocyclic or heterocyclic, preferably aromatic ring, e.g. in coumarins, in thymine or cytosine derivatives or in maleinic acid anhydride derivatives. According to the above definition, $R^1$ and $R^{1'}$ are in such cases fused to form a ring structure, together with Q. One or more atoms of this ring structure or, alternatively, a substituent attached thereto may carry the respective at least one positive or negative charge. Again, such compounds, if carrying at least one positive or negative charge, will fall under the scope of the present invention.

In specific cases, when the photocycloaddition is not a (2+2) cycloaddition, Q may comprise more atoms in its backbone and may e.g. be an aromatic $C_6$ ring which can be fused within an aromatic system or may carry suitable residues at least one of which carries the respective charge(s). One example is an anthracene derivative. Anthracenes are known to undergo a (4+4) cycloaddition whereby carbon atoms 9 and 10 will form bridges to a neighbour atom, resulting in formation of a sandwich-like dimer structure.

Compounds (I) to (IV) may carry more than one group P or Q, respectively. For example, the said compounds are intended to include bisazobenzenes or trisazobenzenes as well as diacrylic ester compounds, e.g. p-phenylene-diacrylic esters.

If R, R', $R^1$ and/or $R^{1'}$ is aryl or an aryl containing group, it may be or may comprise a homocyclic or heterocyclic ring. Optionally, this ring may be fused to an aromatic system, e.g. a naphthalene or anthracene system. Further, the ring can be substituted or functionalized by one or more substituents.

In the definitions given above, the term "functionalized" shall mean substituted by a substituent which implies an additional functionality to the molecule, e.g. a substituent carrying a charge, like a $SO_3H$ group, or a substituent which can provide the capability of polymerization or polyaddition, e.g. a S—H group, or a polymerizable —C=C— group. The term "substituted" shall mean any other substituent.

The compounds as defined above may be used in any kind of salts as available, e.g. ammonium or sodium salts, chlorides, sulfates and the like, or they may be acidic or basic compounds e.g. carboxylic acids, sulfonic acids, amines, or a hydroxy group carrying compounds, and the like, which are capable of reacting with an oppositely charged polyelectrolyte to yield a respective ionic complex. As outlined above, they can be positively or negatively charged, with one or more charges.

Moreover, the inventors have surprisingly found that the photosensitive compound of the above defined complexes, namely $[R-P-R']^{n+}$ n/x $A^{x-}$ (I), or n/x $A^{x+}$ $[R-P-R']^{n-}$ (II), or $[R^1-Q-R^{1'}]^{n+}$ n/x $A^{x-}$ (III), or $[R^1-Q-R^{1'}]^{n+}$ n/x $A^{x-}$ (IV), can be replaced in said material by a photosensitive ("second") polyelectrolyte essentially consisting of or mainly comprising one of the following structures:

$[Pol(R^*-P-R')]_o^{on+} \; no/x \; A^{x-}$ (Ia), or

$no/x \; A^{x+} \; [Pol(R^*-P-R')]_o^{on-}$ (IIa), or

$[Pol(R^{1*}-Q-R^{1'})]_o^{on+} \; no/x \; A^{x-}$ (IIIa), or

$no/x \; A^{x+} \; [Pol(R^{1*}-Q-R^{1'})]_o^{on-}$ (IVa)

wherein Pol means a repeating unit of a linear or branched polymer chain of the polyelectrolyte, o indicates the number of the repeating unit in the polyelectrolyte and (R*—P—R') and (R¹*Q-R¹') are n-fold positively or negatively charged side chains of the repeating unit Pol wherein P is a group which is capable of photoisomerization, preferably a photo-induced E/Z isomerization, R* is selected from optionally substituted and/or functionalized aryl-containing groups bound to the repeating unit Pol and to group P, R' is selected from optionally substituted and/or functionalized aryl-containing groups, wherein at least one of R* and R' is positively or negatively charged, Q is a group capable of participating in a photocycloaddition, preferably a (2+2) addition or a (4+4) addition, or capable of participating in a photoinduced rearrangement, preferably the rearrangement of spiropyranes to merocyanines, or the so called Photo-Fries reaction, R¹* is selected from optionally substituted or functionalized groups which have electron-accepting properties and is bound to the repeating unit Pol and to group Q, R¹' is selected from optionally substituted or functionalized groups which have electron-accepting properties or comprise at least one aryl moiety or such (a) group(s) which together with Q form an aryl ring or heteroaryl ring, wherein at least one of R¹* and R¹' is positively or negatively charged, or wherein the ring structure comprising R¹' and Q and/or a substituent thereon will carry at least one positive or negative charge, A is a cation or anion which is oppositely charged, n is preferably 1 or 2, more preferably 1, but may in specific cases be higher (3 or 4), x is 1 or 2, but can be 3 in specific cases, and o is at least 2, preferably between 2 and 1000, but can be even higher.

The preferred embodiments of the substituents, indices and others as described above for formulae (I), (II), (III) and (IV) are also preferred embodiments for structures (Ia), (IIa), (IIIa) and (IVa), whereby the prior preferred definitions given for R and R¹ (monovalent substituents) shall also apply for R* and R¹* (divalent substituents), as far as this is chemically possible.

Pol can for example be an optionally substituted polyalkylenic unit, preferably a $C_2$-$C_6$ polyalkylene unit, for example an ethylenic unit —$CH_2$—$CH_2$—, wherein one of the carbon-bound hydrogen atoms is replaced by R* or R¹*. Instead, Pol may comprise or consist of an alkyleneoxide or alkylenamine, preferably a $C_2$-$C_6$ alkyleneoxide or alkyleneamine, e.g. —$CH_2$—$CH_2$—O—, or —$CH_2$—$CH_2$—NH—, wherein one of the hydrogen atoms bound to C or N is replaced by R* or R¹*. R* and R¹* can be bound to Pol either via carbon-carbon bonds, but also by way of an ether, ester, amine, amide, urea, guanidino, or sulfonamido or a comparable group. Attachment via a sulfonamido group is preferred; its orientation such that the amino group is bound to Pol is most preferred. In the above mentioned embodiments of Pol, it itself is not charged, which means that the charges are on the groups (R*—P—R') or (R¹*-Q-R¹'), respectively. The structures can then be defined to be

  (Ia'), or

  (IIa'), or

  (IIIa'), or

  (IVa')

Alternatively, units Pol are charged themselves, e.g. may carry an alkylsulfonate group or alkylammonium group or the like, while the groups (R*—P—R') and (R¹*-Q-R¹'), respectively, are also charged or are uncharged.

The expression "essentially consisting", used in connection with the above structures (Ia) to (IVa) shall mean that the said structures constitute the main body of the polyelectrolyte. Of course, a unit [Pol(R*—P—R')$^{n+}$] or any other of the above mentioned units (Ia) to (IVa) cannot exist at the beginning and at the end of the polymer chain, and it is to be understood that the said units will carry an additional substituent, in most cases hydrogen, or eventually an alkyl group (e.g. $C_1$-$C_4$) bound to Pol. The second polyelectrolyte of the present invention may be a homopolymer, i.e. comprising immediately subsequent units of Pol bound to each other. Alternatively, it may consist of a copolymer (statistic or graft copolymer). In this connection, the expression "mainly comprising" shall mean that the chain of "Pol" units can be interrupted and/or that up to half the units (in terms of weight and/or of number) may be replaced by other 2-binding groups, e.g. Pol units which do not carry any of the above defined P or Y containing, photosensitive side chains, or other copolymerizing units, which carry no or other functional or non-functional groups, e.g. carbonic acid or ester groups, unsaturated groups, e.g. ethylenically unsaturated groups, or the like. In other cases, one or more unit(s) [Pol(R*—P—R')$^{n+}$] or any other of the above mentioned units (Ia) to (IVa) may be replaced by a trivalent unit in order to obtain a branched second electrolyte.

The (single) polyelectrolyte to be used according to formulae (I) to (IV) or the other, "first" polyelectrolyte according to formulae (Ia) to (IVa) carries charges which are opposite to those of the photosensitive compound or of the photosensitive polyelectrolyte, respectively, i.e. this polyelectrolyte is a polycation or polyanion. The ionic strength of its cation or anion group may be strong or weak. The said polyelectrolyte may be of natural origin, or may be synthetically prepared. Examples are polyethyleneimine, poly(allylamine hydrochloride), poly(dimethyldiallylammonium chloride), caragenans, polyacrylic acid, sulfonated cellulose, polystyrenesulfonate, Nafion, sol-gel products of alkoxysilanes functionalised with a proton acceptor (e.g. amino-group) to yield ammonium groups or to yield carboxylate groups. The polyelectrolyte can be described as having formula mx/n $Z^{n+}$ [$B^{x-}$]$_m$ or mx/n $Z^{n-}$[$B^{x+}$]$_m$ wherein m is the number of monomer-units in the polyelectrolyte and x is the number of the charge each of the monomer-unit carries. Z is a cation or anion carrying n charges which are opposite to those of the polymer-moiety. Z can be the same as A as defined for formulae I to IV and for formulae Ia to IVa, and m may be in the order of from 2 to 1000 or even more, while n and x are as defined for formulae I to IV.

The materials of formulae (Ia) to (IVa) differ in their properties from those of formulae (I) to (IV) in that they combine two polyelectrolytes. In this way a proper and independent selection of two macromolecular systems will be possible, resulting in the possibility to tailor the desired physical and optical properties, by use of a combinatory system based on ionic interactions between the components. This combination results moreover in improved properties of the complex material with respect to further functionalities (which may be introduced either by the photosensitive polyelectrolyte or by the other, "first", electrolyte), aiming to achieve e.g. the desired solubility, film-forming, and mechanical properties, e.g. rigidity. Moreover, since the photosensitive groups are covalently bound to a polymeric backbone, the resulting systems are very stable.

On the other side, the materials of formulae (I) to (IV) can be prepared in a very simple way, starting from educts which are easily at hand.

In order to obtain the material according to formulae (I) to (IV) of the present invention, at least one polyelectrolyte as defined above and at least one photosensitive compound as defined above are each dissolved in a suitable solvent. In order to obtain the material according to formulae (Ia) to (IVa) of the present invention, at least one "first" polyelectrolyte as defined above and at least one second, photosensitive polyelectrolyte as defined above are likewise each dissolved in a suitable solvent. Since for each case, both components (the single polyelectrolyte and the photosensitive compound or, the "first" polyelectrolyte and the second, photosensitive polyelectrolyte) are ionic, they are usually soluble in protic and polar solvents, in most cases in water or a lower alcohol or a mixture of both. The mixtures should preferably be considerably concentrated, often until saturation. The ratio of photosensitive compound or photosensitive polyelectrolyte to the only or "first" polyelectrolyte should preferably be not less than 0.5:1, in relation to the number of charges. This means that per each charge of the single or the "first" polyelectrolyte, at least 0.5 charges of a photosensitive compound or 0.5 charges of a photosensitive moiety $(R^*—P—R')^{n+}$ or any other of the above photosensitive moieties defined for formulae (Ia) to (IVa) above, respectively, should be present. The remaining charges of the single or "first" polyelectrolyte can be compensated by additives, e.g. ionic oligomers or additional ionic dyes or the like, as required and/or desired. An excess of photosensitive compound is not critical, i.e. the ratio can be 1:1 or even higher in order to achieve higher dye loading (and to improve consequently the effectivity of the material).

The respective solutions are then mixed in order to obtain the complex of ionic photosensitive compound and polyelectrolyte, or the complex of the second, photosensitive polyelectrolyte and the "first" polyelectrolyte, respectively. These complexes may be described to consist of one or more of the following: In case they have been obtained using a photosensitive compound according to formulae (I) to (IV):

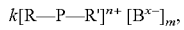

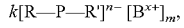

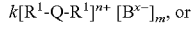

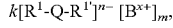

wherein k is 0.5->1 (mx/n) and the other indices and residues are as given above.

In case they have been obtained using a photosensitive polyelectrolyte according to formulae (Ia) to (IVa):

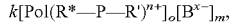

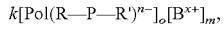

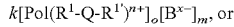

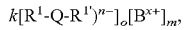

wherein k·o=0.5->1 (mx/n) and the other indices and residues are as given above, while $[B^+]$ and $[B^{x-}]$ means the polycation and the polyanion, respectively, of the polyelectrolyte, each carrying x positive or negative charges.

Alternatively, it is possible to mix the said photosensitive compound of any of formulae (I) to (IV) or said second, photosensitive polyelectrolyte of any of formulae (Ia) to (IVa) with a non-ionic polymer, the polymer having groups within each monomeric unit which only upon addition of protons (acid) or a Lewis base become ionic and charged so that the polymer is converted into a polyelectrolyte. Examples for such non-ionic polymers are polymers comprising a Lewis base in each of their monomer units which may accept a proton or acid groups from which a proton can be taken. In such cases, a respective Lewis base or proton donor compound is added after mixing, in order to obtain the desired, inventive complex.

Depending on the nature of other parts of the complexes, they will either remain soluble in the mixture, or they might be less soluble, due to a lower polarity, compared to the starting compounds. If the complexes precipitate at least partly, they can be taken up and redissolved in a less polar solvent, e.g. in water/alcohol mixtures containing more alcohol, in a longer chain alcohol, in a mixture of alcohol with another solvent, e.g. an aprotic solvent, or in a ketone like acetone or an ether like tetrahydrofuran, if desired. Further, it is possible to exchange any of the solvents of the initial solutions against another, more desired solvent, e.g. by evaporating the first solvent and taking up the complex with another solvent or solvent mixture.

Additives may be incorporated at any stage prior to forming the films, as appropriate. They may either be added to any of the solutions prior to the preparation of the complex, or may be added to the complex in any stage. Additives for each of the materials may be, for example, organic polymers, compounds having film forming abilities, plasticizers, liquid crystals and/or photosensitive compounds which in case of materials made from photosensitive compounds of formulae (I) to (IV) of course need to differ from the photosensitive compounds having formulae (I) to (IV), but may differ in each of the materials.

The complex according to the present invention is rather stable, due to its ionic character. Specifically, it will be resistant against the influence of heat in a much larger extent than comparable materials which are not of ionic nature. Such materials will in general soften at lower temperatures.

In a specific embodiment of the invention, the materials of the present invention comprise at least on of the inventive complexes defined above, together with one or more additional components which may undergo or provide cross-linking of the film, preferably after structurization. Such components may be selected from additional organic monomers which are capable to bind to specific groups of the polyelectrolyte, forming bridges and/or an organic network. In one embodiment, this component is selected from monomeric photosensitive molecules which are capable to undergo photopolymerisation or photocross-linking. Preferably, the conditions of photopolymerisation or cross-linking should be such that a wavelength is used which is different from that used for "recording" (SRG formation) as mentioned above. In another embodiment, this component is susceptible to thermal curing or polymerizes/provides bridges or a cross-linking network upon thermal treatment.

Depending on the solvent, any of the conventional film forming techniques like spin-coating or casting, doctor's blading and the like can be used to prepare homogeneous films on a substrate in merely one step. In addition, ink-jet printing to produce patterned films, is also readily available using e.g. water/alcoholic media. After the film has been deposited on the substrate or the respective basic layer, it is allowed to dry, preferably at room temperature, for example in air.

The thickness of the films may vary in a broad range, depending on the desired application. For example, it may vary between 10 nm and 50 μm, typically between 200 nm and 5 μm. If desired, additional layers may be deposited, either between the substrate and the film of the inventive photosensitive material and/or as one or more covering layers on the upper surface of the film.

The photoactive material according to the invention is light-sensitive, due to the presence of groups in the complex which may either undergo light-induced E/Z isomerization and/or photocycloaddition reactions, or light induced rearrangement reactions. Under homogeneous irradiation with polarized actinic light, optical anisotropy is induced within films made from this material. The optical anisotropy may be stable, temporary stable, unstable or erasable in dependence on the material composition, treatment and irradiation conditions, as outlined below. Under inhomogeneous irradiation, both a modulation of optical anisotropy and a deformation of film surface may be achieved. Most surprisingly, the latter process is as effective or even more effective as reported for azobenzene containing functionalized polymers that have been known as the most effective for the surface relief gratings formation. In this regard the material of the present invention is a viable alternative to the covalently bonded polymer systems used until now.

As mentioned above, the properties of the proposed material may be optically modified in different ways. If irradiated homogeneously with polarized light, the film becomes anisotropic, that means, birefringence and/or dichroism are induced. This is due to a photoorientation process in the steady state of the photoisomerization in the material upon polarized irradiation. For example, if the material contains groups which undergo E/Z isomerization, light irradiation will result in an orientation of such groups. In case of photocycloadditions or other photoreactions, an angular-selective photo-decomposition or angular-selective formation of photoproducts will be observed.

The optical anisotropy induced in such a way may relax back, be erased thermally or by irradiation with light, or may be stable. For example since Z isomers relax back to the thermodynamic stable E isomers, the induced orientation based on the E/Z isomerization may be stable, may undergo relaxation, or may be erased thermally or photochemically. Thus, the optical anisotropy of azobenzene systems is only temporary induced, while surface relief gratings formed therewith are long-term stable, see below. However, optical anisotropy and surface gratings due to photocycloaddition will remain stable since the reaction is not reversible. Stability of optical anisotropy may also be achieved by using a material which allows further curing or cross-linking, e.g. by building up an organic network within the film. In such cases, light induced optical anisotropy may be "frozen" in the material when the material is cured after inducing said an isotropy.

The velocity of the induction and relaxation processes, if any, may be controlled through adjusting the temperature and/or the parameters of irradiating/erasing light. In this way a variety of thin film polarization elements like polarizer or retarder may be created that may be permanent or optically switchable. The light-induced change of birefringence or dichroism in this material may be also effectively used for optical data storage and, if reversible, for optical processing.

If a film is irradiated with an inhomogeneous light field, i.e. a light field wherein the intensity or/and polarization of irradiating light is spatially modulated, the induced anisotropy is correspondingly modulated through the film. One example of this is irradiation through a mask. In this way, pixel thin film polarization elements may be fabricated. Another example is irradiation with an interference pattern, i.e. holographic irradiation. In this way, a variety of holographic optical elements operating in transmission or reflection modes (like polarization beam splitter or polarization discriminator) may be realized.

Moreover, surface relief structures may be generated on the free surface of films made from the material of the present invention by inhomogeneous irradiation with polarized light (holographic, mask or near-field exposure). Surface relief structures may be a result of a photo-induced mass transport upon an E/Z photoisomerization reaction or upon photocycloaddition or photoinduced rearrangement reaction (e.g. caused by shrinkage due to ring formation).

If a film made of the material of the present invention is irradiated inhomogeneously, formation of surface relief structures (surface relief gratings, SRGs) can be observed along with the generation of inhomogeneous optical anisotropy. However, formation of SRGs can, if required or desired, be suppressed by irradiating a film between two substrates. In respect to reversibility and irreversibility of surface relief structures, the same applies as outlined above for the occurrence of optical anisotropy.

The lateral size of generated structures ranges from tens of nanometers (in the case of irradiation with near-field) up to some microns. It is being demonstrated here that the efficiency of the relief formation is comparable to the values reported for the azobenzene functionalized polymers (modulation depth of 2 μm was achieved). Atomic force microscopy (AFM) images of SRG written in the materials of the present invention, made from a photosensitive compound according to one of formulae (I) to (IV) (1a), from a photosensitive polyelectrolyte according to one of formulae (Ia) to (IVa) (1c) and, for comparison, in side chain azobenzene polymers of the prior art (1b) are shown in FIG. 1.

There are unique possibilities of the material application, due to the reversibility of the recording process, if a material is selected which allows reversible formation of surface relief structures. Once a relief structure has been recorded, it may be overwritten again. This allows the recording of complicated surface structures by superimposing their simple components. In this way, for example, multidimensional structures may be realized by successive recordings of simple one-dimensional structures; gratings with non-sinusoidal profile may be formed by successive recording of Fourier components or any recorded structure may be in a point way corrected. Another benefit of the reversibility of the process is the possibility of multiple use of the film. A high number of writing cycles without fatigue is possible. On the other hand, if generated in the material with additive as described above, the final relief structure may be "frozen" or fixed, for example, thermally or by flood exposure (exposure of the whole film) in order to obtain cross-linking or the like and to avoid destruction of the resulting relief.

In this way a variety of relief holographic elements like diffraction grating, beam coupler, beam multiplexer, splitter or deflector, Fresnel lens and the like may be created.

Applications of structured films (in particular gratings) are not restricted to optical elements only. One step all-optical structured surfaces may be used as templates for self-organisation of particles, as command surface for alignment of liquid crystals, as surface with modified wetting/dewetting properties, functionalized surfaces for biological application (micro fluidic, surface topology for modified interactions with biomolecules and cells) or as antireflective layers.

If surface relief structures have been prepared according to the invention, such structures may be replicated using a wide variety of different materials. Replication may be performed once or manifold. A replica may again serve as template for replication. Materials which are useful for replication are known in the art. Examples are polysiloxanes, e.g. polydimethylsiloxane. Such materials may be prepared as resins having sufficiently low viscosity to fill the fine structures of the SRG and may be dried or cured after replication to yield a stable material. Other examples are polyacrylate resins, polyurethanes, ene-thiol compositions or a metal, e.g. via electrochemical deposition from a metal solution. The initial surface relief structure can be washed out from the replica, if desired, using an appropriate solvent.

The materials of the present invention have, inter alia, the following advantages: they can be manufactured from readily available non-expensive commercial materials, namely commercially available polyelectrolytes and photochromic derivatives with ionic groups. There is a great flexibility in their preparation, as well as in the composition of the materials and systems (multi-component systems). It is possible to use environmental friendly water/alcoholic media as solvents. Since the complexes and formulations are prepared in protic solvents like water and/or alcoholic media, films can easily be prepared on polymeric or other (e.g. inorganic) substrates or combined with other polymer layers which are not stable in organic solvents usually used for polymer film manufacturing, but would allow to form another layer from water/alcoholic media. Ink-jet printing will be also readily available with water/alcoholic solvents. In case of a replication of SRGs and other topological surface structures using other polymer or non-polymer material, the initial photosensitive film with the photo-induced structure can be washed out by solvents. Anisotropic films and surface relief structures can be produced using the new material without expensive synthesis and purification of photochromic polymers wherein the photochromic unit must be covalently attached to the polymer backbone. And due to the ionic nature of the using materials, the film and products made from this film, e.g. SRGs, are thermally stable, at least until about 150-200° C.

Due to their superior chemical and physical (optical, mechanical) properties, the material of the present invention may be used in a wide variety of technical fields, and specifically in the field of technical and other optics, data storage and telecommunication. For example, the material may be used as a photosensitive medium, optical element, functional surface and/or template. Said elements may e.g. be diffractive elements, polarization elements, focusing elements or combinations of such elements. If the light-induced properties thereof are reversible, they can be used as or in elements for optical or optical/thermal switching. In such cases, the material is preferably prepared by a method as claimed in claim 27 or 28. Further, if the light-induced properties are reversible, it may be used as a medium for real-time holography or optical information processing. Alternatively, the photosensitive medium can be a medium for irreversible or reversible optical data storage. If the data storage is reversible, written information can subsequently be eliminated by irradiation or heating, if desired, whereafter another writing cycle is possible. In other applications, the material is used as a template, wherein the template surface is a surface for replication to another material or the command surface for aligning of liquid crystals, self-organization of particles. The surface may determine the chemical, mechanical and/or optical properties of the material, preferably selected from wetting/dewetting, hardness, reflectance and scattering.

BRIEF DESCRIPTION OF THE DRAWINGS

The attached figures illustrate some of the properties of the films of the invention, wherein FIG. 9 illustrates the comparison of a grating and its replica as described in Example 10a.

DESCRIPTION OF PREFERRED EMBODIMENTS

Below, the invention shall be exemplified further.

Example 1a

Figure 1A:
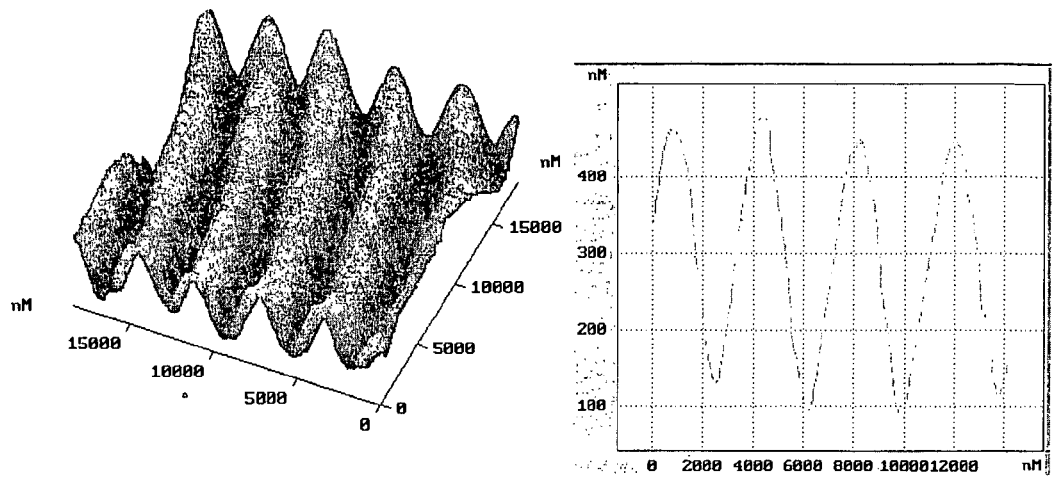
FIG. 1 is a AFM image of SRG written in material of Example 1a (FIG. 1*a*), in poly((4-(4-trifluoromethylphenylazophenyl-4-oxy) butyl)methacrylate)-co-poly((2-(4-cyanobiphenyl-4-oxy)ethyl)methacrylate) (FIG. 1*b*), and in material of Example 1f (FIG. 1*c*)
Figure 1B:
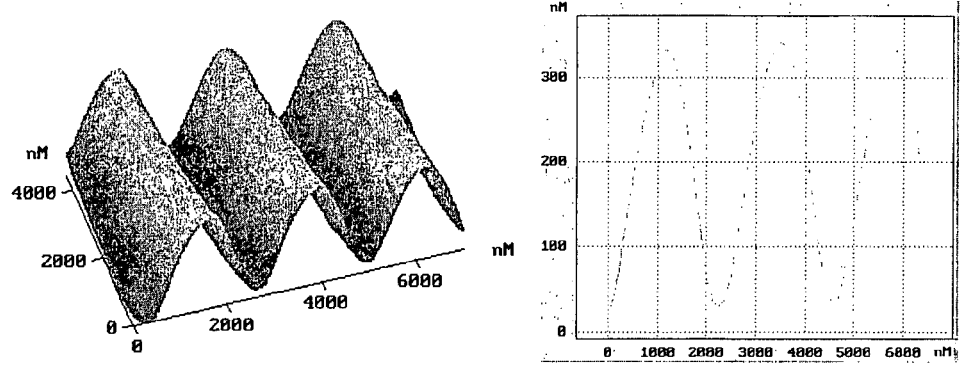
Figure 1C:
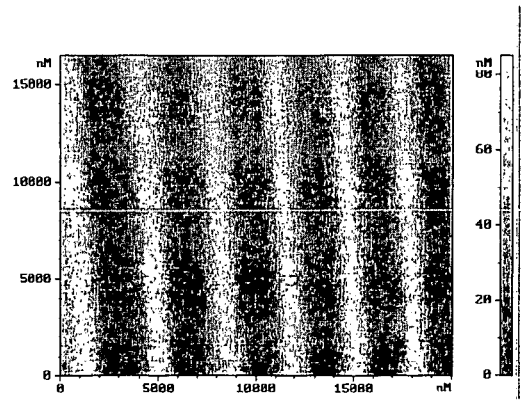
Figure 2:
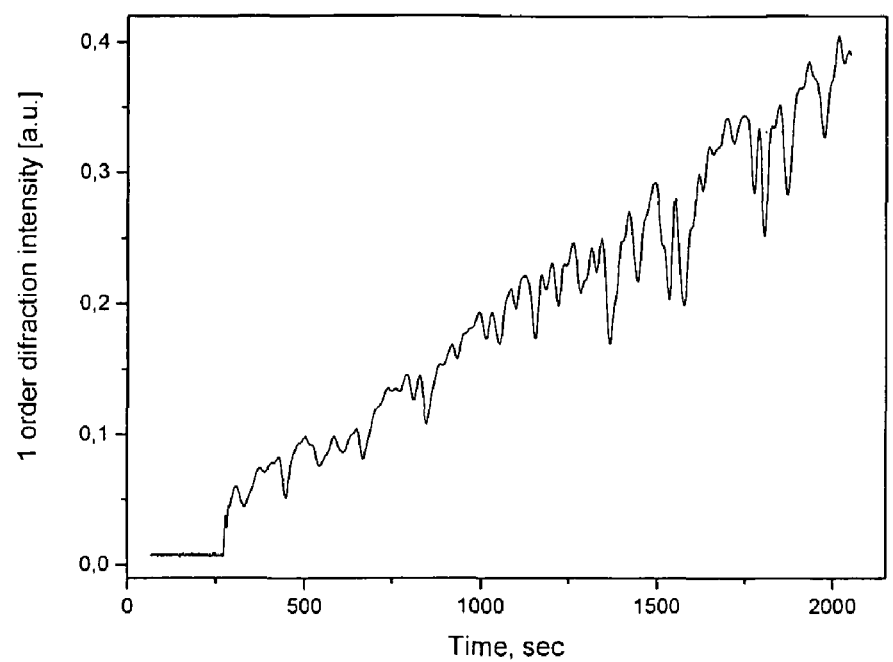
FIG. 2 shows the intensity of the $1^{st}$ order diffracted beam during recording of SRG in the Example 1a, FIG. 2*a* shows the intensity of the $1^{st}$ order circulary polarized diffracted beam during recording of orientation grating in the Example 1g.

Recording 54 mg of Alizarin Yellow GG (5-(3-Nitrophenylazo)salicylic acid sodium salt, Aldrich) was dissolved in 20 ml of distilled water, 40 µl of 30% aqueous solution polyethyleneimine was added. The deposit was separated by filtration (30 mg after drying) and dissolved in 1 ml of THF, while the mother solution was discarded. A film of about 2 µm thickness was fabricated from the THF solution by casting onto the glass substrate in a close chamber at room temperature. After drying at room temperature in air for 5 h, the film was irradiated with the interference pattern formed by two linearly orthogonally polarized beams with polarisation planes at ±45° to the incidence plane. The irradiation wavelength was 488 nm, and the angle between beams was about of 12° resulting in a period of 2.3 µm. The intensities of interfering beams were equal to 250 mW/cm², the irradiation time was 40 min. The $1^{st}$ order diffraction efficiency measured during the recording is shown in FIG. 2. $1^{st}$ order diffraction efficiency at the end of recording was measured to be 16.5%. The induced surface relief was investigated by means of AFM and revealed a SRG with amplitude of ca. 350 nm. The measured topography and the related cross-section are shown in FIG. 1.

Example 1b

Recording 63 mg of Brilliant Yellow (4,4'-bis(4-hydroxyphenylazo) stylbene-2,2'-disulfonic acid disodium salt, Aldrich), were dissolved in 5 ml methanol and then filtered. 130 mg 30% aqueous solution of polyethyleneimine (Aldrich) was added. Since some deposit was formed, the solution was allowed to settle and decanted. The red mother solution was used for the film preparation. A film of about 3 μm thickness was prepared by casting this solution onto the glass substrate in a close chamber at room temperature. After drying at room temperature in air for 5 h, the film was irradiated for 40 min as described in example 1a. The $1^{st}$ order diffraction efficiency of the SRG recorded was measured to be 14.5%.

Example 1c

Recording

To 80 mg of Brilliant Yellow (Aldrich) in 2 ml methanol, 130 mg of triethoxy-3-aminopropylsilane (Witco Europa SA) was added. After adding 10 μm concentrated HCl, the solution was left to settle. The clear red mother solution was decanted. A film of about 3 μm thickness was prepared by casting this solution onto the glass substrate in a close chamber at room temperature. After drying at room temperature in air for 10 h, the film was irradiated for 30 min as described in example 1a. The $1^{st}$ order diffraction efficiency of the SRG recorded was measured to be 8%.

Example 1d

Recording

To 28 mg of 4-(dimethylamino)-4'-nitroazobenzene (Aldrich) in 1 ml of MeOH, acidified by HCl was added 0.2 ml of 5% solution of polyacrylic acid Na salt in MeOH. A film of about 1 μm thickness was prepared by spin-coating of this solution onto the glass substrate at 1000 rpm. After drying at room temperature in air for 2 h, the film was irradiated for 30 min as described in example 1a. The $1^{st}$ order diffraction efficiency of the SRG recorded was measured to be 2%.

Example 1e

Recording

To 34 mg of azobenzene-4-carboxylic acid (Aldrich) in 6 ml of MeOH, 60 mg of 20% aqueous solution of poly(diallyldimethylammonium chloride) was added. A film of about 1 μm thickness was prepared by spin-coating of this solution onto ink-jet transparency film at 500 rpm. After drying at room temperature in air for 3 h, the film was irradiated for 30 min as described in example 1a. The $1^{st}$ order diffraction efficiency of the SRG recorded was measured to be 2.5%.

Example 1f

Recording

To 45 mg of poly{1-[4-(3-carboxy-4-hydroxyphenylazo) benzenesulfonamido]-1,2-ethanediyl, sodium salt} (PAZO) (Aldrich) in 1.5 ml of MeOH 35 mg of 30% aqueous solution polyethyleneimine was added. A film of about 2 μm thickness was prepared by casting this solution onto the glass substrate in a close chamber at room temperature. After drying at room temperature in air for 20 h the film was irradiated for 30 min with the interference pattern formed by two linearly orthogonally polarized beams with polarization planes at ±45° to the incidence plane. The irradiation wavelength was 488 nm, and the angle between beams was about of 12° resulting in a period of 2.3 μm. The intensities of interfering beams were equal to 250 mW/cm², the irradiation time was 40 min. The $1^{st}$ order diffraction efficiency of the SRG recorded was measured to be 15%.

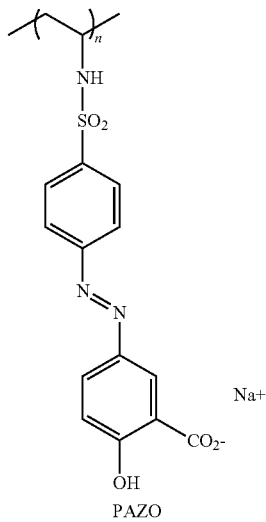

PAZO

Example 1g

Orientation Grating Recording

Figure 2A:
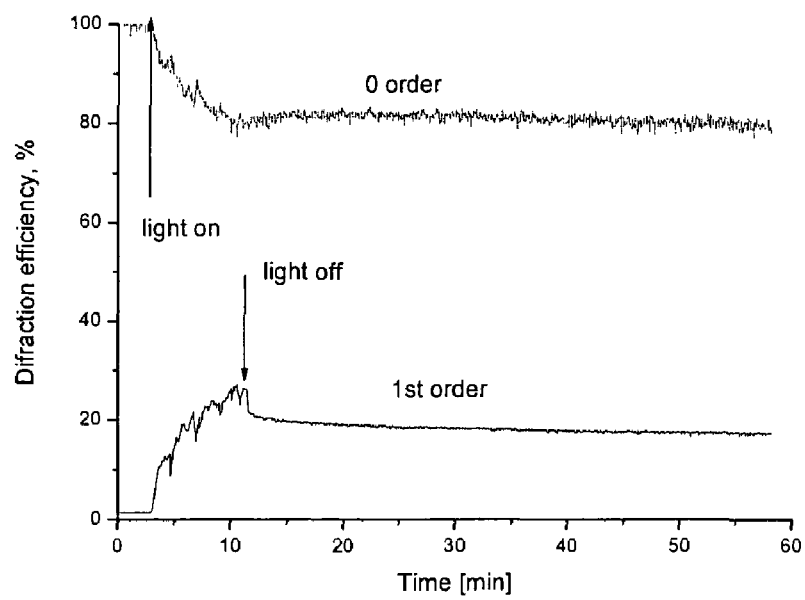

The film from the material of the Example 1f was irradiated with the interference pattern formed by two circularly left and right polarized beams. The irradiation wavelength was 488 nm, and the angle between beams was about of 120 resulting in a period of 2.3 μm. The intensities of interfering beams were equal to 250 mW/cm², the irradiation time was 10 min. The $1^{st}$ order diffraction efficiency measured during the recording with circularly polarized probe beam is shown in FIG. 2a.

Example 2

Erasing with Light

Figure 3:
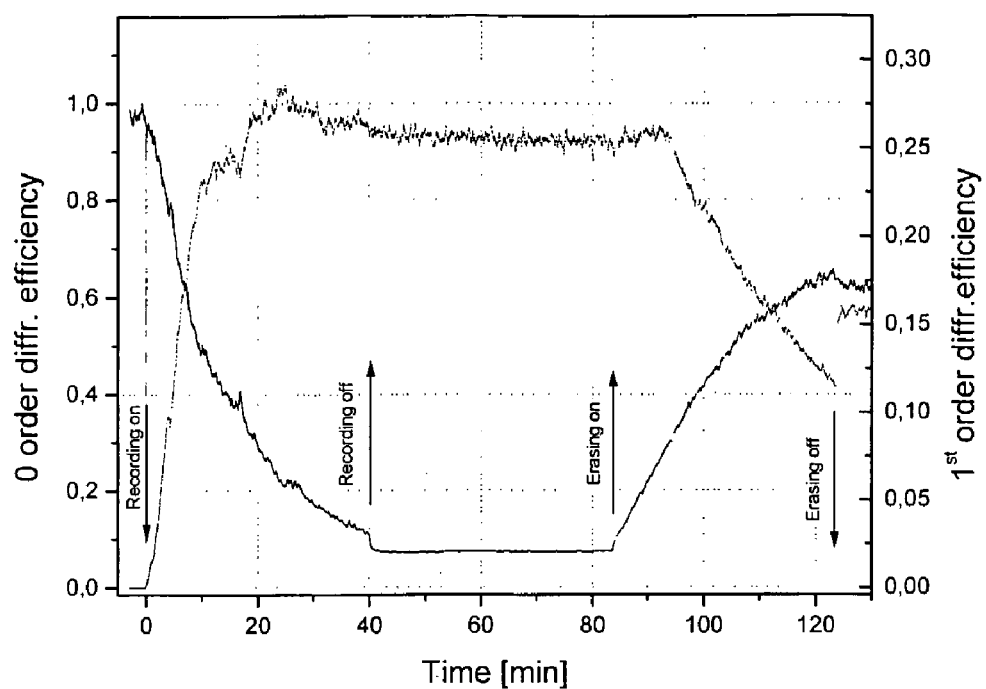
FIG. 3 illustrates the intensities of the $0^{th}$ and $1^{st}$ order diffracted beams during recording and erasing of SRG in the Example 2.

The film from the material of the Example 1a was irradiated with the interference pattern formed by two linearly orthogonally polarized beams with polarisation planes at ±45° to the incidence plane. The irradiation wavelength was 488 nm, and the angle between beams was about of 12° resulting in a period of 2.3 μm. The intensities of interfering beams were equal to 250 mW/cm², the irradiation time was 40 min. For the erasing of grating one of the recording beams was used. Thus the polarisation of the erasing light was linear with polarisation plane at 45° to the grating grooves and the intensity of light was 250 mW/cm². The $0^{th}$ and $1^{st}$ order diffraction efficiencies measured during the recording and erasing of the grating are shown in FIG. 3.

Example 3

Thermal Erasing

Figure 4:
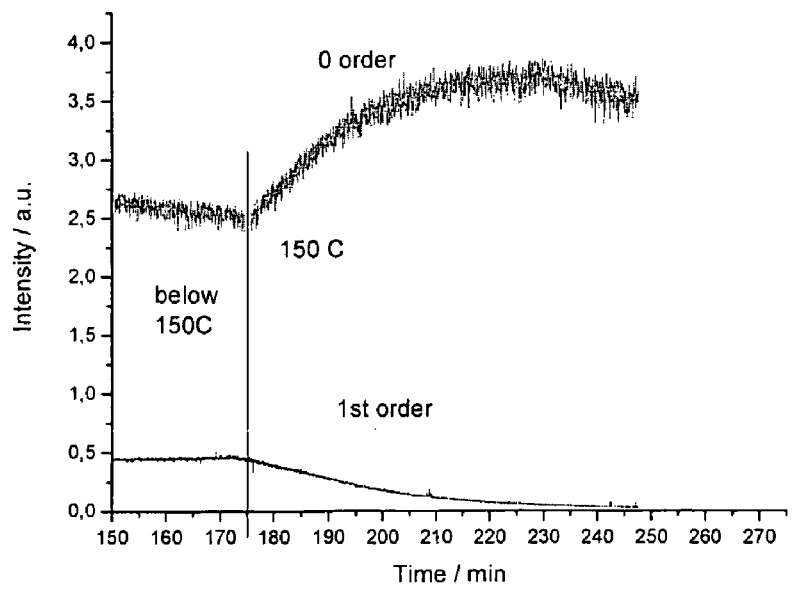
FIG. 4 illustrates the intensities of the $0^{th}$ and $1^{st}$ order diffracted beams by SRG written in Example 1a during erasing at the temperature of 150°.

The film with the inscribed grating as in Example 1a was step-wise heated to a final temperature of 150°. Until 150° the grating was stable. At this temperature thermal erasing evident by decreasing $1^{st}$ order diffraction efficiency and by increasing 0 order diffraction efficiency started. The erasing was followed for 60 min (FIG. 4).

Example 4

Rewriting

Figure 5:
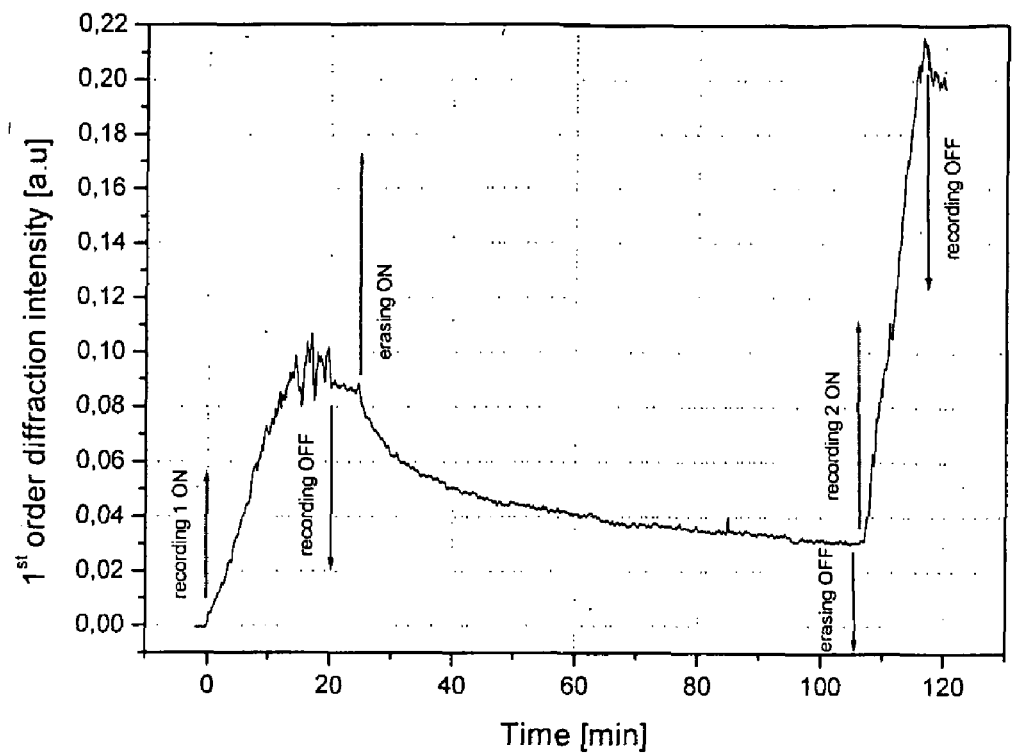
FIG. 5 shows the intensity of the $1^{st}$ order diffracted beam during the first and the second recordings onto the same spot on the film of Example 1a, FIG. 6 is an AFM image of square SRG written in two steps into a material of Example 1b, FIG. 7(*a*) illustrates the induction and relaxation of optical anisotropy of Example 7a: intensity of the orthogonally polarised components of the transmitted probe beam; (b) induction and relaxation of optical anisotropy of Example 7b.

A grating as in Example 1a was rewritten into the film of Example 2. FIG. 5 presents the diffraction efficiency measured during recording of the first grating, erasing with linearly polarized light and the recording of second grating onto the same spot of the film. The second recording has been done with a higher intensity thus resulting in a much faster formation of a grating.

Example 5

Multiple Recording

Figure 6:
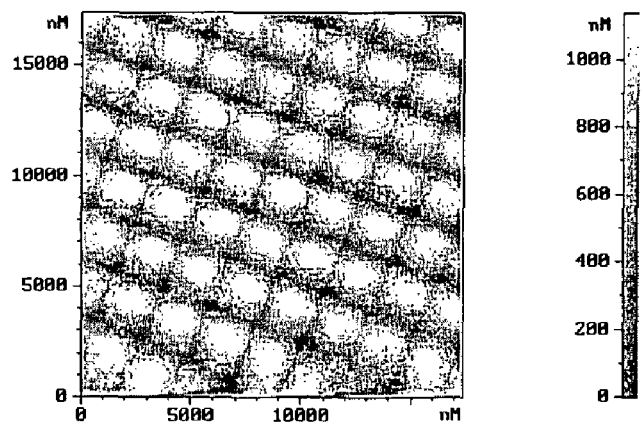

A film of about 2 μm thickness was prepared as in Example 1b. Two gratings were successively inscribed into the same spot on a film. Between the two recording steps the film was rotated at 90° around the normal to the film plane. As a result a 2-dimensional structure was inscribed that is a combination of two linear gratings inscribed in the single steps. The AFM topology image of induced structure is shown in FIG. 6.

Example 6

Comparison of Recording Configurations

The gratings were recorded into the films of the material of the Example 1a. The period of the gratings, recording intensities and irradiation times were kept constant for all gratings. The polarisation of the recording beams was varied: i) linear parallel ss; ii) linear parallel pp; iii) linear orthogonal ±45°; iv) linear orthogonal 0°, 90°; v) circular parallel; vi) circular orthogonal. The obtained diffraction efficiencies and the relief modulation depths are shown in Table 1. It is well seen that the linear orthogonal ±45° polarisation configuration is the most effective one. The circular orthogonal polarisations also result in a formation of SRG although less effective then linear orthogonal ±45°. Among the parallel polarisation configurations the most effective is the linear parallel pp one while the linear parallel ss configuration at the applied recording conditions does not result in any appreciable surface relief.

TABLE 1

Diffraction efficiency and relief depth for SRG written in different configurations (Example 6).

| | linear orthogonal ±45° | linear orthogonal 0°, 90° | linear parallel pp | linear parallel ss | circular parallel | circular orthogonal |
|---|---|---|---|---|---|---|
| $1^{st}$ order DE, % | 18.5 | 0 | 6 | 0 | 0.6 | 11.2 |
| $2^{nd}$ order DE, % | 1.3 | 0 | 0.4 | 0 | 0 | 0.9 |
| relief, nm | 230 | 0 | 80 | 0 | 30 | 180 |

Example 7a

Reversible Anisotropy

Figure 7A:
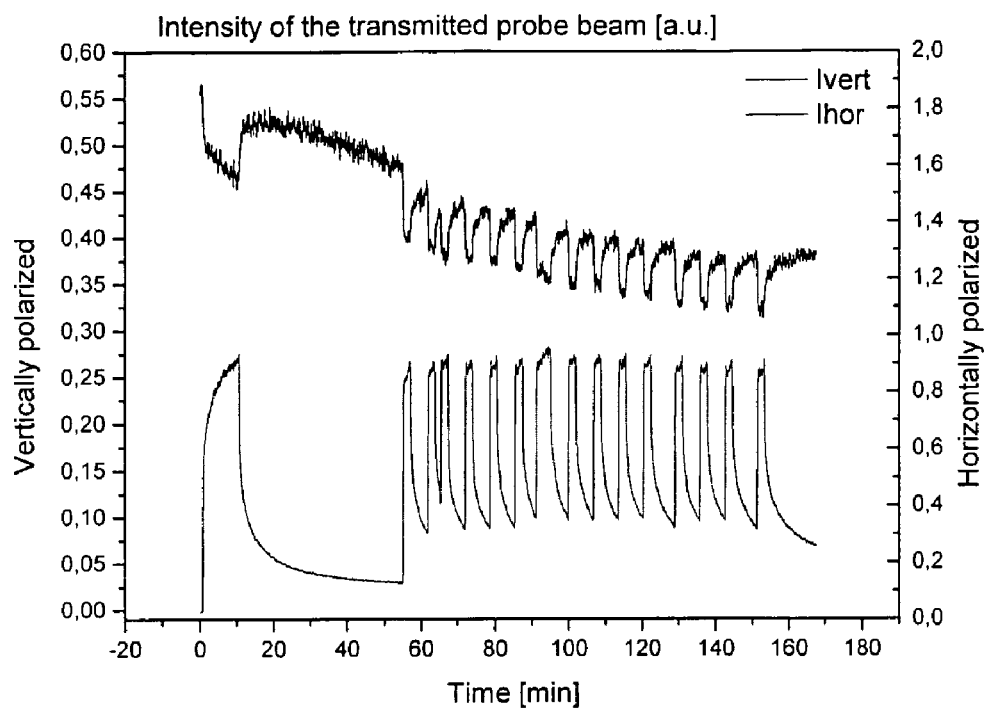

A film of the material of Example 1a was exposed to the linearly polarized light of the wavelength of 488 nm. The induction and the relaxation of the optical anisotropy were detected in real time by means of a probe beam of a He—Ne laser operating at a wavelength of 633 nm. The probe light was linearly polarized at 45° to the polarisation plane of the irradiating beam. The transmitted probe beam was split into two orthogonally polarized beams by means of a Wollaston-prism. The intensities of both orthogonal polarisation components, i.e. the component with the polarisation of the incident probe beam and a new component with orthogonal polarisation rising due to the induced birefringence, were measured. FIG. 7a represents the time behaviour of the induced optical anisotropy. Fifteen induction/relaxation cycles are shown, whereas during the first cycle the saturation and the complete relaxation of the signal were reached. It is seen that at the applied intensity and the wavelength of irradiation the induction time is of about 3 min. The time constant of dark relaxation is estimated to be of 8 min. The anisotropy was almost completely erased and then induced again. No fatigue is noticed after 30 induction/erasure cycles.

Example 7b

Reversible Anisotropy

Figure 7B:
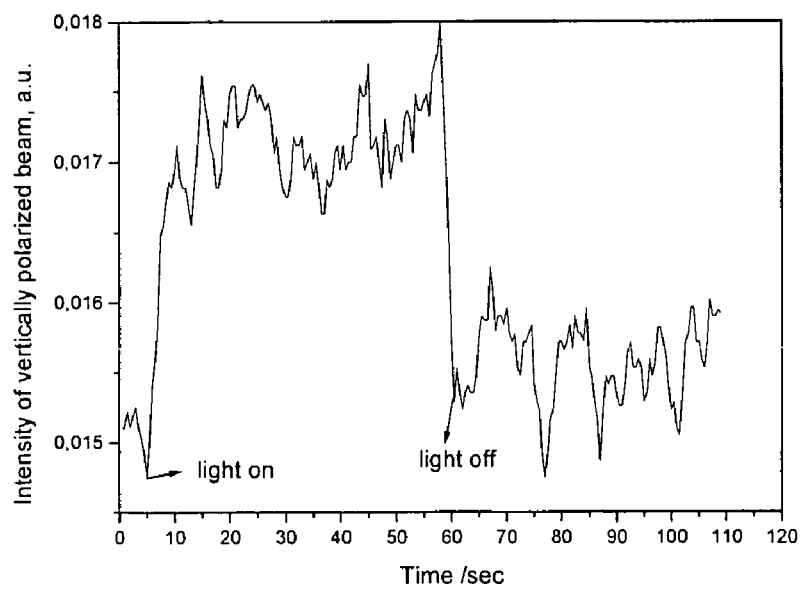

To 36 mg of 4-Phenylazoaniline hydrochloride (Aldrich) in 3 ml of MeOH 17 mg poly(acrylic)acid (Fluka) in 1 ml of water was added. A film of about 2 μm thickness was prepared by casting this solution onto the glass substrate in a close chamber at room temperature. After drying at room temperature in air for 20 h the film was irradiated as described in Example 7a, Optical anisotropy is shown in FIG. 7b.

Example 8

Switchable Anisotropy

Figure 8A:
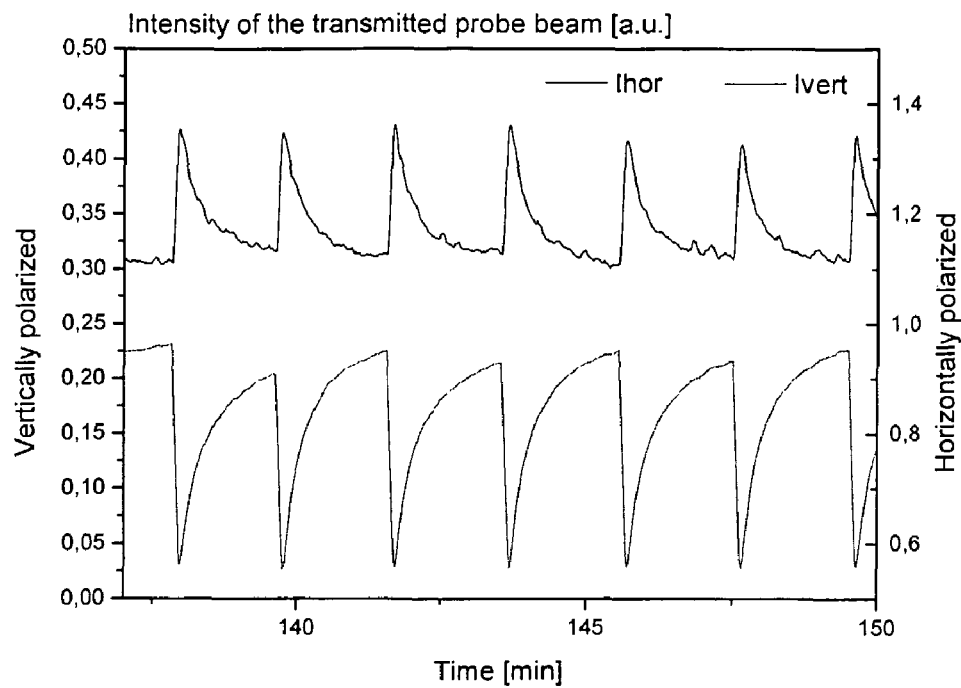
FIG. 8 illustrates the intensity of the orthogonally polarised components of the transmitted probe beam: a) switching between two states under alternating irradiation; b) dynamics of single switch.
Figure 8B:
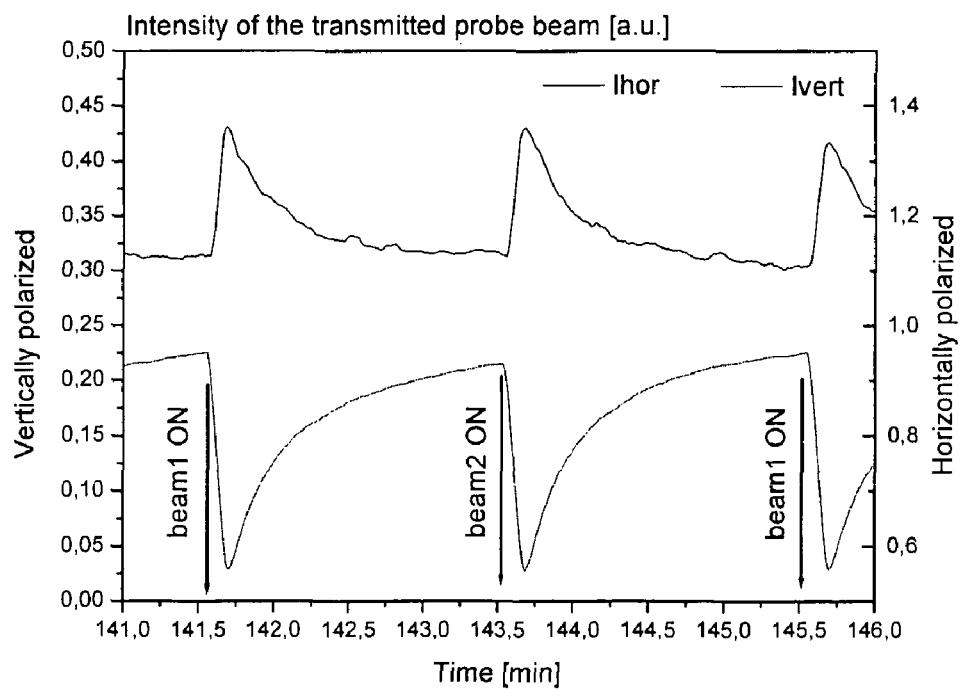

A film of the material of Example 1 was alternatively exposed to linearly polarized light with orthogonal polarisation planes. The wavelength of the irradiation was 488 nm. The induction of the optical anisotropy was detected as in Example 7a. FIG. 8a represents the switching of the induced optical anisotropy and FIG. 8b shows the switching dynamics. It is seen that the induced optical anisotropy is completely switched between two states by the irradiation with properly polarized light.

Example 9

Photoinduced Anisotropy

Figure 11:
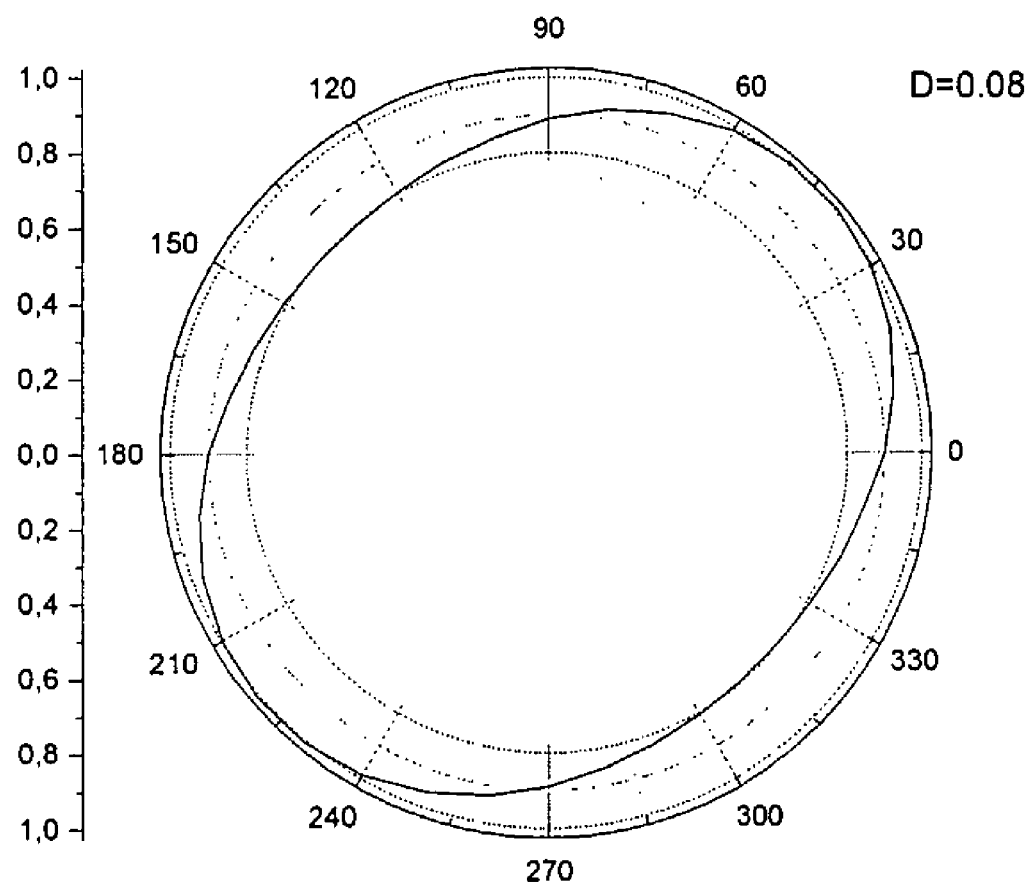
FIG. 11 is a polar diagram of absorption at 500 nm versus angle of polarization of the final state of orientation in a material of Example 9.

To 45 mg of poly{1-[4-(3-carboxy-4-hydroxyphenylazo) benzenesulfonamido]-1,2-ethanediyl, sodium salt} (PAZO) (Aldrich) in 1.5 ml of MeOH 35 mg of 30% aqueous solution polyethyleneimine was added. A film of about 2 μm thickness was prepared by casting this solution onto the glass substrate in a close chamber at room temperature. After drying at room temperature in air for 20 h the film was irradiated by linearly polarised light of 488 nm and 250 mW/cm$^2$ for 1 h. Induced birefringence was stable, but could be erased by the light of proper polarization and induced again in any other direction. The induced anisotropy was investigated by polarised UV-vis spectroscopy (FIG. 11, polar diagram). The value of optical dichroism has been found at 500 nm to be 0.08.

Example 10a

Replication

Figure 9:
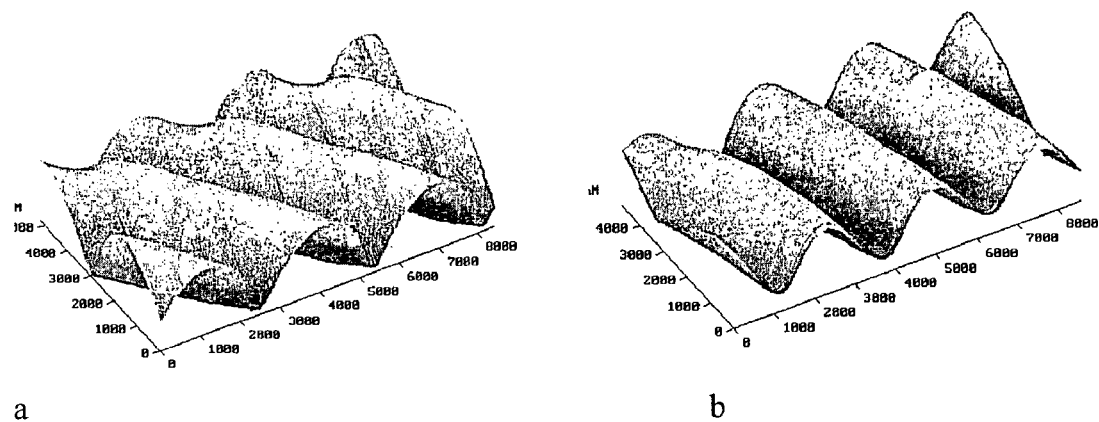
Figure 10:
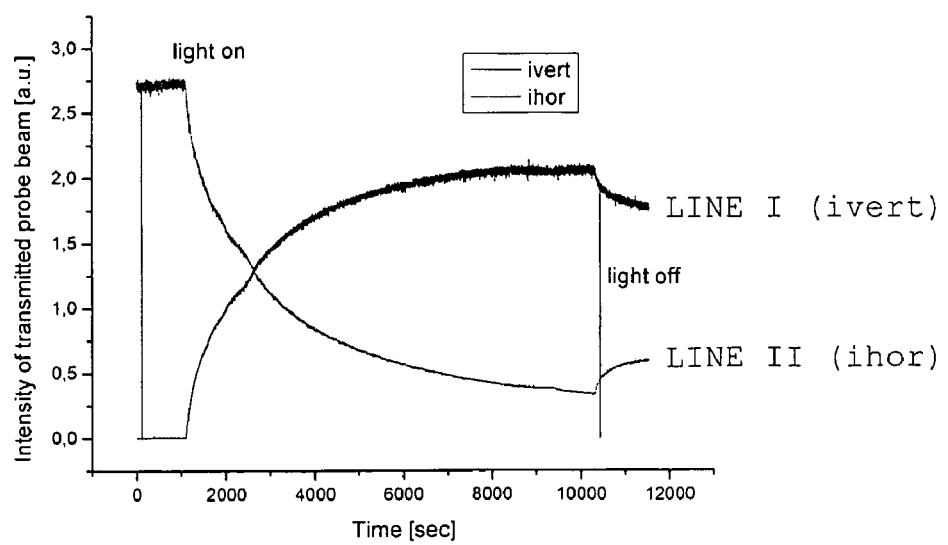
FIG. 10 illustrates the induction of optical anisotropy in a material of Example 1f.

The surface relief structure as in Example 1a was replicated into polydimethylsiloxane (PDMS) by pouring a mixture of Sylgard silicone elastomer 184 and curing agent (10:1) on the top of the SRG and allowing it to be hardened for 3 h at 60 C. The comparison of grating and replica is shown in the FIG. 9. The original grating had amplitude of ca. 700-800 nm, replica has the same relief shape and amplitude of 400-500 nm.

Example 10b

Replication

Norland optical adhesive NOA65 (Norland corporation) was poured onto the surface of SRG obtained as in Example 1a and immediately irradiated for 30 sec. with UV light to harden. Separation of NOA layer from SRG yields the replica of grating in NOA material.

Example 10c

Replication

Example 9b was repeated, however, instead of NOA65, a two component adhesive (curing time approx. 5 min at 60° C.) was used. After pouring the adhesive mixture onto the grating and hardening it for about 10 min at 60° C. the replica was easily separated from the grating.

Example 10d

Replication

A surface relief grating as obtained in any of examples 1 was soaked in 1.2 mg/ml solution of SnCl$_2$ (activation solution) for 30 min. and then electroless plated with Ag by pouring onto the surface of the grating the following solution: 120 mg AgNO$_3$, 200 μl 30% NH$_3$ solution, 80 mg NaOH in 20 ml of water. After washing with water, the Ag covered grating was used as cathode in Ni electrochemical plating in the following Ni plating bath: 50 ml water, 6.4 g NiSO$_4$, 2.4 g Na$_2$SO$_4$×10H$_2$O, 1 g MgSO$_4$, 2 g H$_3$BO$_3$, 0.25 g NaCl. Plating condition were Ni sacrificial anode, current density 20 mA/cm$_2$, stirring.

What is claimed:

1. A film forming, photoactive, homogeneously mixed material comprising an ionic complex prepared from
(a) at least one ionic photosensitive compound which may undergo a photoreaction, selected from photoisomerizations, photocycloadditions and photoinduced rearrangements, wherein the photosensitive compound is of formula I or formula II $$[R\text{—}P\text{—}R']^{n+} \; n/x \, A^{x-} \quad \text{(I) or}$$

$$n/x \, A^{x+} \, [R\text{—}P\text{—}R']^{n-} \quad \text{(II)}$$

wherein P is a group capable of photoisomerization, and R and R' are independently selected from optionally substituted or functionalized aryl-containing groups at least one of which is positively or negatively charged, A is an oppositely charged cation or anion, n is an integer, and x is 1, 2 or 3, and/or the photosensitive compound is of formula III or IV:

$$[R^1\text{-}Q\text{-}R^{1'}]^{n+} \; n/x \, A^{x-} \quad \text{(III) or}$$

$$n/x \, A^{x+} \, [R^1\text{-}Q\text{-}R^{1'}]^{n-} \quad \text{(IV)}$$

wherein Q is a group capable of participating in a photocycloaddition or photoinduced rearrangement reaction, and R$^1$ and R$^{1'}$ are independently selected from optionally substituted or functionalized groups having electron-accepting properties and optionally substituted or functionalized aryl-containing groups and from such groups which together with Q form an aryl ring or heteroaryl ring, wherein either at least one of R$^1$ and R$^{1'}$ is positively or negatively charged or the ring structure and/or a substituent thereon will carry at least one positive or negative charge, wherein A, n and x are defined as for formulae I and II with the proviso that in all compounds of formulae (I) to (IV) contained in one complex, the charge of [R—P—R'] and/or [R$^1$-Q-R$^{1'}$] has the same sign, and/or (a') at least one photosensitive polyelectrolyte ("second polyelectrolyte") carrying residues which may undergo a photoreaction, selected from photoisomerizations, photocycloadditions and photoinduced rearrangements, wherein said second polyelectrolyte essentially consists of or mainly comprises at least one structure according to formula Ia or formula IIa $$[\text{Pol}(R^*\text{—}P\text{—}R')]_o^{on+} \; n/x \, A^{x-} \quad \text{(Ia), or}$$

$$n/x \, A^{x+} \, [\text{Pol}(R^*\text{—}P\text{—}R')]_o^{on-} \quad \text{(IIa),}$$

and/or
of formula IIIa or IVa:

$$[\text{Pol}(R^{1*}\text{-}Q\text{-}R^{1'})]_o^{on+} \; n/x \, A^{x-} \quad \text{(IIIa), or}$$

$$n/x \, A^{x+} \, [\text{Pol}(R^{1*}\text{-}Q\text{-}R^{1'})]_o^{on-} \quad \text{(IVa)}$$

wherein Pol means a repeating unit of a linear or branched polymer chain, o indicates the number of the repeating unit of the polymer chain, and (R*—P—R') and (R$^{1*}$-Q-R$^{1'}$) are n-fold positively or negatively charged side chains of the repeating unit Pol, wherein P, R', R$^{1'}$, Q, A, x and n are defined as for formulae (I) to (IV) above, R* is selected from optionally substituted and/or functionalized aryl-containing groups bound to the repeating unit Pol and to group P, wherein at least one of R* and R' is positively or negatively charged, R$^{1*}$ is selected from optionally substituted or functionalized groups which have electron-accepting properties and is bound to the repeating unit Pol and to group Q, wherein at least one of $R^{1*}$ and $R^{1'}$ is positively or negatively charged, or wherein the ring structure comprising $R^{1'}$ and Q and/or a substituent thereon will carry at least one positive or negative charge, and o is at least 2, preferably between 2 and 1,000, but can be even higher, with the proviso that in one complex, groups [R*—P—R'] and/or [$R^{1*}$-Q-$R^{1'}$] all have the same sign, and (b) at least one polyelectrolyte carrying charges which are opposite to those of the active groups [R—P—R'] and/or [$R^1$-Q-$R^{1'}$] and/or those of the active groups (R*—P—R') and/or ($R^{1x}$-Q-$R^{1'}$) of the photosensitive material, respectively, said polyelectrolyte being a sol-gel product and selected from charged polysiloxanes formed in situ by hydrolytic condensation of alkoxy- and/or chlorosilanes carrying a positive or negative charge, preferably carboxy group containing silanes, or by hydrolytic condensation of neutral silanes and subsequent introduction of a charged group thereto, preferably an ammonium group into an aminosiloxane.

2. The material according to claim 1, wherein the structures (Ia) to (IVa) are of formulae

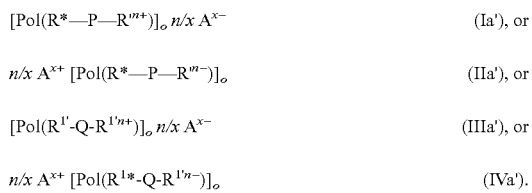

3. The material according to claim 1, wherein group P and group Q in formulae (I) to (IV) and/or (Ia) to (IVa) are selected from —N=N—, —$CR^2$=$CR^{2'}$— with $R^2$, $R^{2'}$ being independently selected from H, CN or i $C_1$-$C_4$ alkyl, and a group containing more than one —N=N— and/or —$CR^2$=$CR^{2'}$— moieties in an electron-conjugated system.

4. The material according to claim 1, wherein in formulae (I), (Ia), (II) or (IIa), the aryl moieties of R, R', or of R*, R', respectively, are directly bound to the group P, and/or wherein in formulae (III), (IIIa), (IV) or (IVa), $R^1$ and $R^{1'}$ or $R^{1*}$ and $R^{1'}$, respectively, are selected from aryl moieties directly attached to Q, and —C(O)O— and —(CO)$NR^3$ groups wherein $R^3$ is H or an optionally substituted alkyl or aryl group.

5. The material according to claim 1, wherein the at least one photosensitive compound is selected from monoazo compounds, bisazo compounds, trisazo compounds, and preferably from azobenzenes, bisazobenzenes, trisazobenzenes, and further from stilbenes, cinnamates, imines, anthracenes, coumarines, chalcones, p-phenylene diacrylates or diacrylamides, thymin derivatives, cytosine derivatives, merocyanines/spiropyranes and derivatives of maleinic acid anhydride, or wherein the at least one second photosensitive polyelectrolyte is selected from a polyelectrolyte carrying monoazo groups, bisazo groups, trisazo groups, and preferably carrying azobenzene groups, bisazobenzene groups, trisazobenzene groups, and further from stilbene groups, cinnamate groups, imine groups, anthracene groups, coumarine groups, chalcone groups, p-phenylene diacrylate groups or diacrylamide groups, thymin derivatives, cytosine derivatives, merocyanine/spiropyrane groups and maleinic acid anhydride containing groups.

6. The material according to claim 1, prepared by using at least one photosensitive polyelectrolyte according to any of formulae (Ia), (IIa), (IIIa), and (IVa), wherein R* and $R^{1*}$ are bound to the monomer units Pol via a carbon-carbon bond, or by way of an ether, ester, amine, amide, urea, guanidino, or sulfonamido group.

7. The material according to claim 1, comprising at least one additive modifying properties of the material, wherein the at least one additive is preferably selected from organic polymers, compounds which have film forming abilities, plasticizers, liquid crystals, and photosensitive compounds differing from those defined in claim 1.

8. The material according to claim 1, comprising a monomeric photosensitive molecule, which is capable of undergoing polymerization or of providing cross-linking, induced either by irradiation with light or by thermal treatment.

9. A film made from the material according to claim 1 in the form of a layer or a film on a substrate or in the form of a free-standing film, wherein the film is optionally patterned, wherein the material has been applied as a chemically homogeneous mixture.

10. The film according to claim 9, the material being capable of changing upon irradiation with light at least one optical property that is preferably selected from the group consisting of refraction, absorption, birefringence, dichroism and gyrotropy.

11. The film according to claim 10, wherein the at least one optical property is either
(a) homogeneous through the material, or
(b) varied through the material or through restricted areas thereof.

12. The film according to claim 11, variant (b), wherein the at least one optical property is modulated in one, two or three dimensions including modulation in the direction perpendicular to a plane of the film, in any direction in the plane of the film or along an axis tilted to the plane of the film.

13. The film according to claim 10, wherein induced changes of the at least one optical property or/and a light-induced relief structure are either
(a) reversible, or
(b) irreversible.

14. The film according to claim 13, variant (a), wherein the induced changes of the at least one optical property or/and of the relief structure are stable when kept at day light below a glass transition temperature or a decomposition temperature of the material.

15. The film according to claim 14, wherein the induced changes of optical properties or/and of the relief structure are cyclically induced with light and erased optically or thermally.

16. The film according to claim 15, wherein a light-induced optical property is reversible, in the form of a medium for real-time holography or optical information processing.

17. The film according to claim 13, wherein a light-induced optical property is reversible, in the form of an element for optical or optical/thermal switching.

18. The film according to claim 9 in the form of a film on a substrate or of a free-standing film, wherein at least one free surface exhibits a light-induced relief structure.

19. The film according to claim 18, wherein the relief structure is a regular pattern with height modulated in one or two dimensions.

20. The film according to claim 9 as a photosensitive medium, optical element, functional surface and/or template.

21. The film according to claim 20, wherein the optical element is selected preferably from a diffractive element, a polarization element, focusing element or any combination of said elements.

22. The film according to claim 20, wherein the photosensitive medium is a medium for irreversible or reversible optical data storage.

23. The film according to claim 22, wherein written information can be eliminated by irradiation or heating, whereafter another writing cycle is possible.

24. The film according to claim 20, wherein a template surface of the template is a surface for replication to another material or a command surface for aligning liquid crystals or self-organization of particles.

25. The film according to claim 20, wherein the functional surface is determines chemical, mechanical, optical properties of the material that are preferably selected from the group consisting of wetting/dewetting, hardness, reflectance, and scattering.

26. A method for the preparation of a material according to claim 1 comprising the steps of:
 separately dissolving the ionic photosensitive compound(s) (a) or at least one second, photosensitive polyelectrolyte (a'), respectively, and one or more polyelectrolytes (b);
 combining the respective solutions; and
 optionally redissolving precipitated material in a less polar solvent.

27. The method according to claim 26, further comprising the steps of:
 casting, spin coating, doctor's blading or ink-jet printing the material onto a substrate, either as a continuous film or a predesigned pattern, wherein the material is applied as a chemically homogenous mixture throughout the film or the predesigned pattern.

28. The method according to claim 27, further comprising the step of irradiating said film or a part of said film with a homogeneous light field to create optical properties that are homogenous through the material.

29. The method according to claim 27, further comprising the step of irradiating said film or a part of said film with an inhomogeneous light field, provided by a mask or by an interference pattern of at least two intersecting coherent beams to create optical properties that are varied through the material or through restricted area of the material.

30. The method according to claim 29, further comprising the step of modulating the optical properties in one, two or three dimensions, including modulation in a direction perpendicular to a plane of said film, in any direction in the plane of said film or along an axis tilted relative to the plane of said film.

31. The method according to claim 29, wherein either a wavelength, an irradiation time, a number of irradiating beams and/or a polarization, an intensity, an incidence angle of at least one irradiating beam is varied to control a direction, a value and/or a modulation type of an induced optical anisotropy and/or a surface topology.

32. The method according to claim 31, further comprising the step of varying a mask spacing or a period of an interference pattern in order to control a spatial modulation of the optical anisotropy and/or the surface topology.

33. The method according to claim 32, further comprising the step of changing the inscribed structures (correcting or overwriting) by successively inhomogeneously irradiating said film, preferably through a mask, with a focused beam, with near field, or with an interference pattern of at least two intersecting coherent beams.

34. The method according to claim 33, further comprising the step of preparing structures with complicated (non-rectangular and non-sinusoidal) profile by multi-step (successive) irradiation, preferably with interference patterns corresponding to Fourier components of the desired profile.

35. The method according to claim 33, further comprising the step of preparing complicated multidimensional structures by multi-step (successive) irradiation, preferably differing by a position of the material, irradiation conditions and/or the interference pattern.

36. The method according to claim 29, further comprising the step of erasing induced changes by either homogeneous irradiation of said film or part of said film with a light or/and by heating said film or part of said film.

37. The method according to claim 36, wherein either a wavelength, an irradiation time, a polarization, an intensity, an incidence angle of an erasing beam and/or a temperature, a rate, time of heating is varied to control a velocity and degree of erasure and a final state of the material.

38. The method according to claim 27, further comprising the step of inhomogeneously irradiating said film to create at least one free surface exhibiting a light-induced relief structure, wherein the step of irradiating is carried out preferably through a mask, with a focused beam, with near field, or with an interference pattern of at least two intersecting coherent beams.

39. The method according to claim 38, further comprising the step of erasing induced changes by either homogeneous irradiation of said film or part of said film with a light or/and by heating said film or part of said film.

40. The method according to claim 39, wherein either a wavelength, a irradiation time, a polarization, an intensity, an incidence angle of an erasing beam and/or a temperature, a rate, a time of heating is varied to control a velocity and degree of erasure and a final state of the material.

41. A method for the preparation of a replica of a surface relief structure, comprising the steps of:
 (i) preparing a first material according to the method of claim 38 to obtain a surface relief structure on said first material;
 (ii) covering said surface relief structure or a part of said surface relief structure with a second material selected from organic and inorganic-organic polymers and/or metals;
 (iii) curing or hardening said second material, if required;
 (iv) separating said second material from said surface relief structure of said first material to obtain a negative replica; and optionally
 (v) repeating the steps (ii) to (iv) if more than one replica of said surface relief structure of said first material is to be obtained.

42. A method for the preparation of a reproduction replica of an original surface relief structure, comprising the steps of:
 (i) preparing a first material according to the method of claim 38 to obtain a surface relief structure on said first material;
 (ii) covering said surface relief structure or a part of said surface relief structure with a second material selected from organic and inorganic-organic polymers and/or metals;
 (iii) curing or hardening said second material, if required;
 (iv) separating said second material from said surface relief structure of said first material or washing out said first material with a suitable solvent to obtain a negative replica;
 (v) covering a negative relief structure of said negative replica with a third material selected from organic and inorganic-organic polymers and metal,
 (vi) curing or hardening said third material, if required, (vii) separating said third material from said negative relief structure of said second material to obtain a positive replication replica of said surface relief structure of said first material, and (viii) repeating the steps (v) to (vii) if more than one replication replica from said surface relief structure of said first material is to be obtained.

43. A method for the preparation of a replica of a surface relief structure, comprising the steps of:

(i) preparing a first material according to the method of claim 33 to obtain a surface relief structure on said first material;

(ii) covering said surface relief structure or a part of said surface relief structure with a second material selected from organic and inorganic-organic polymers and/or metals;

(iii) curing or hardening said second material, if required;

(iv) separating said second material from said surface relief structure of said first material to obtain a negative replica; and optionally (v) repeating the steps (ii) to (iv) if more than one replica of said surface relief structure of said first material is to be obtained.

44. A method for the preparation of a reproduction replica of an original surface relief structure, comprising the steps of:

(i) preparing a first material according to the method of claim 33 to obtain a surface relief structure on said first material;

(ii) covering said surface relief structure or a part of said surface relief structure with a second material selected from organic and inorganic-organic polymers and/or metals;

(iii) curing or hardening said second material, if required;

(iv) separating said second material from said surface relief structure of said first material or washing out said first material with a suitable solvent to obtain a negative replica;

(v) covering a negative relief structure of said negative replica with a third material selected from organic and inorganic-organic polymers and metal, (vi) curing or hardening said third material, if required;

(vii) separating said third material from said negative relief structure of said second material to obtain a positive replication replica of said surface relief structure of said first material, and (viii) repeating the steps (v) to (vii) if more than one replication replica from said surface relief structure of said first material is to be obtained.

45. The material according to claim 1, wherein:

the ionic complex, when obtained using a photosensitive compound according to formulae (I) to (IV), is k[R—P—R']$^{n+}$ [B$^{x-}$]$_m$, k[R—P—R')$^{n-}$ [B$^{x+}$]$_m$, k[R$^1$-Q-R$^{1'}$]$^{n+}$ [B$^{x-}$]$_m$, or k[R$^1$-Q-R$^{1'}$]$^{n-}$ [B$^{x+}$]$_m$, wherein k is 0.5 to 1 (mx/n) and the other indices and residues are as defined; and the ionic complex, when obtained using a photosensitive polyelectrolyte according to formulae (Ia) to (IVa), is k[Pol(R*—P—R')$^{n+}$]$_o$ [B$^{x-}$]$_m$, k[Pol(R—P—R')$^{n-}$]$_o$ [B$^{x+}$]$_m$, k[Pol(R$^1$-Q-R$^{1'}$)$^{n+}$]$_o$ [B$^{x-}$]$_m$, or k[Pol(R$^1$-Q-R$^{1'}$)$^{n-}$]$_o$ [B$^{x+}$]$_m$, wherein (k×o) is 0.5 to 1 (mx/n) and the other indices and residues are as defined, wherein [B$^{x+}$] is the polycation and [B$^{x-}$] is the polyanion, respectively, of the polyelectrolyte, each carrying x positive or negative charges.

46. A free standing film, wherein at least one free surface thereof exhibits a light induced relief structure, wherein the film consists of a photoactive, homogeneously mixed material comprising a complex prepared from (a) at least one ionic photosensitive compound which may undergo a photoreaction, selected from photoisomerizations, photocycloadditions and photoinduced rearrangements, wherein:

the photosensitive compound is of formula I or formula II

wherein P is a group capable of photoisomerization, and R and R' are independently selected from optionally substituted or functionalized aryl-containing groups at least one of which is positively or negatively charged, A is an oppositely charged cation or anion, n is an integer, and x is 1, 2 or 3, and/or the photosensitive compound is of formula III or IV:

wherein Q is a group capable of participating in a photocycloaddition or photoinduced rearrangement reaction, and R$^1$ and R$^{1'}$ are independently selected from optionally substituted or functionalized groups having electron-accepting properties and optionally substituted or functionalized aryl-containing groups and from such groups which together with Q form an aryl ring or heteroaryl ring, wherein either at least one of R$^1$ and R$^{1'}$ is positively or negatively charged or the ring structure and/or a substituent thereon will carry at least one positive or negative charge, wherein A, n and x are defined as for formulae I and II with the proviso that in all compounds of formulae (I) to (IV) contained in one complex, the charge of [R—P—R'] and/or [R$^1$-Q-R$^{1'}$] has the same sign, and/or (a') at least one photosensitive polyelectrolyte ("second polyelectrolyte") carrying residues which may undergo a photoreaction, selected from photoisomerizations, photocycloadditions and photoinduced rearrangements, wherein said second polyelectrolyte essentially consists of or mainly comprises at least one structure according to formula Ia or formula IIa

and/or of formula IIIa or IVa:

wherein Pol means a repeating unit of a linear or branched polymer chain, o indicates the number of the repeating unit of the polymer chain, and (R*—P—R') and (R$^{1*}$-Q-R$^{1'}$) are n-fold positively or negatively charged side chains of the repeating unit Pol, wherein P, R', R$^{1'}$, Q, A, x and n are defined as for formulae (I) to (IV) above, R* is selected from optionally substituted and/or functionalized aryl-containing groups bound to the repeating unit Pol and to group P, wherein at least one of R* and R' is positively or negatively charged, R$^{1*}$ is selected from optionally substituted or functionalized groups which have electron-accepting properties and is bound to the repeating unit Pol and to group Q, wherein at least one of $R^{1*}$ and $R^{1'}$ is positively or negatively charged, or wherein the ring structure comprising $R^{1'}$ and Q and/or a substituent thereon will carry at least one positive or negative charge, and o is at least 2, preferably between 2 and 1,000, but can be even higher, with the proviso that in one complex, groups [R*—P—R'] and/or [$R^{1}$*-Q-$R^{1'}$] all have the same sign, and (b) at least one polyelectrolyte carrying charges which are opposite to those of the active groups [R—P—R'] and/or [$R^{1}$-Q-$R^{1'}$] and/or those of the active groups (R*—P—R') and/or ($R^{1x}$-Q-$R^{1'}$) of the photosensitive material, respectively.

* * * * *

UNITED STATES PATENT AND TRADEMARK OFFICE
CERTIFICATE OF CORRECTION

PATENT NO. : 8,026,021 B2
APPLICATION NO. : 11/574672
DATED : September 27, 2011
INVENTOR(S) : Stumpe et al.

It is certified that error appears in the above-identified patent and that said Letters Patent is hereby corrected as shown below:

Column 5, line 4 and line 59, the formula "$(R^1*Q\text{ -}R^{1\prime})$" should be changed to -- $(R^{1}*\text{-}Q\text{-}R^{1\prime})$ --.

Column 5, line 65, "(IIa')" should be changed to -- (IIIa') --.

Column 14, line 46, the text "the angle between beams was about of 120 resulting" should be changed to -- the angle between beams was about 12° resulting --.

Signed and Sealed this
Fifth Day of February, 2013

Teresa Stanek Rea
*Acting Director of the United States Patent and Trademark Office*